(12) United States Patent
Murase et al.

(10) Patent No.: US 9,130,167 B2
(45) Date of Patent: Sep. 8, 2015

(54) METHOD OF MANUFACTURING A NONVOLATILE MEMORY DEVICE HAVING A VARIABLE RESISTANCE ELEMENT WHOSE RESISTANCE VALUE CHANGES REVERSIBLY UPON APPLICATION OF AN ELECTRIC PULSE

(71) Applicant: Panasonic Corporation, Osaka (JP)

(72) Inventors: Hideaki Murase, Osaka (JP); Yoshio Kawashima, Osaka (JP); Atsushi Himeno, Osaka (JP); Takumi Mikawa, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/122,151

(22) PCT Filed: Mar. 27, 2013

(86) PCT No.: PCT/JP2013/002098
§ 371 (c)(1),
(2) Date: Nov. 25, 2013

(87) PCT Pub. No.: WO2013/145741
PCT Pub. Date: Oct. 3, 2013

(65) Prior Publication Data
US 2014/0110659 A1 Apr. 24, 2014

(30) Foreign Application Priority Data
Mar. 29, 2012 (JP) ................................. 2012-077948

(51) Int. Cl.
*H01L 21/20* (2006.01)
*H01L 45/00* (2006.01)
*H01L 27/24* (2006.01)

(52) U.S. Cl.
CPC ........ *H01L 45/1675* (2013.01); *H01L 27/2472* (2013.01); *H01L 45/08* (2013.01); *H01L 45/1233* (2013.01); *H01L 45/1253* (2013.01); *H01L 45/146* (2013.01)

(58) Field of Classification Search
CPC ................................. H01L 45/00; H01L 21/02
USPC ................ 257/4, E45.003, E21.004; 438/104
See application file for complete search history.

(56) References Cited

U.S. PATENT DOCUMENTS 8,022,502 B2 9/2011 Kanzawa et al.
8,389,972 B2 3/2013 Mikawa et al.
(Continued)

FOREIGN PATENT DOCUMENTS

JP 2010-287683 12/2010
JP 2011-91325 5/2011
(Continued)

OTHER PUBLICATIONS

International Search Report issued Jul. 2, 2013 in corresponding International Application No. PCT/JP2013/002098.
(Continued)

*Primary Examiner* — Caleb Henry
(74) *Attorney, Agent, or Firm* — Wenderoth, Lind & Ponack, L.L.P.

(57) ABSTRACT

A method of manufacturing a nonvolatile memory device includes: forming a first electrode; forming, above the first electrode, a metal oxide material layer including a first metal oxide; forming a mask above part of the metal oxide material layer main surface; forming, in a region of the metal oxide material layer not covered by the mask, a high oxygen concentration region including a second metal oxide having a lower degree of oxygen deficiency than the first metal oxide; removing the mask; forming, above a first variable resistance layer including the high oxygen concentration region and a low oxygen concentration region that is a region of the metal oxide material layer other than the high oxygen concentration region, a second variable resistance layer including a third metal oxide having a lower degree of oxygen deficiency than the first metal oxide; and forming a second electrode above the second variable resistance layer.

7 Claims, 19 Drawing Sheets

(56) References Cited

U.S. PATENT DOCUMENTS

| | | |
|---|---|---|
| 8,437,173 B2 | 5/2013 | Hayakawa et al. |
| 8,445,319 B2 | 5/2013 | Kanzawa et al. |
| 8,456,890 B2 | 6/2013 | Ichihara |
| 8,476,614 B2 | 7/2013 | Sumino et al. |
| 8,492,743 B2 | 7/2013 | Mikawa et al. |
| 2009/0283736 A1 | 11/2009 | Kanzawa et al. |
| 2010/0314602 A1 | 12/2010 | Takano et al. |
| 2011/0095255 A1 | 4/2011 | Sumino et al. |
| 2011/0182103 A1* | 7/2011 | Smythe et al. ............ 365/148 |
| 2011/0220863 A1 | 9/2011 | Mikawa et al. |
| 2011/0294259 A1 | 12/2011 | Kanzawa et al. |
| 2012/0063193 A1 | 3/2012 | Ichihara |
| 2012/0063201 A1* | 3/2012 | Hayakawa et al. ......... 365/148 |
| 2012/0267598 A1* | 10/2012 | Sakotsubo et al. ............. 257/4 |
| 2013/0140514 A1 | 6/2013 | Mikawa et al. |
| 2013/0295745 A1* | 11/2013 | Takahashi et al. ........... 438/382 |
| 2014/0117305 A1* | 5/2014 | Yasuhara et al. ............... 257/4 |
| 2014/0312293 A1* | 10/2014 | Mikawa et al. ................ 257/4 |

FOREIGN PATENT DOCUMENTS

| | | |
|---|---|---|
| JP | 4722236 | 7/2011 |
| JP | 2012-64271 | 3/2012 |
| WO | 2008/149484 | 12/2008 |
| WO | 2011/114725 | 9/2011 |

OTHER PUBLICATIONS

Informal Comments regarding the Written Opinion of the International Searching Authority for International Application No. PCT/JP2013/002098, filed in response to the Written Opinion issued Jul. 2, 2013 in corresponding International Application No. PCT/JP2013/002098 (with English translation).

J. McPherson et al., "Proposed Universal Relationship Between Dielectric Breakdown and Dielectric Constant", IEDM 2002, pp. 633-636, Dec. 8-11, 2002.

Akira Usami, et al., "Semiconductor Engineering for Integrated Circuits", Kougyou Chuosakai (Engineering Investigation Committee), 1992, pp. 47-48, Fig. 2.1 (with English translation).

* cited by examiner

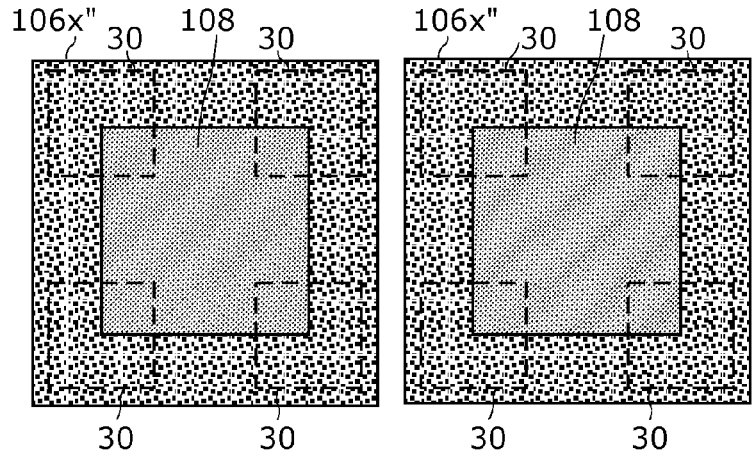
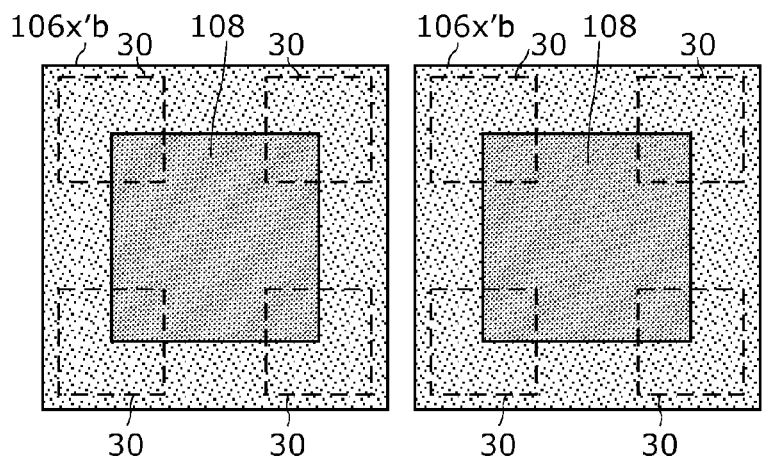
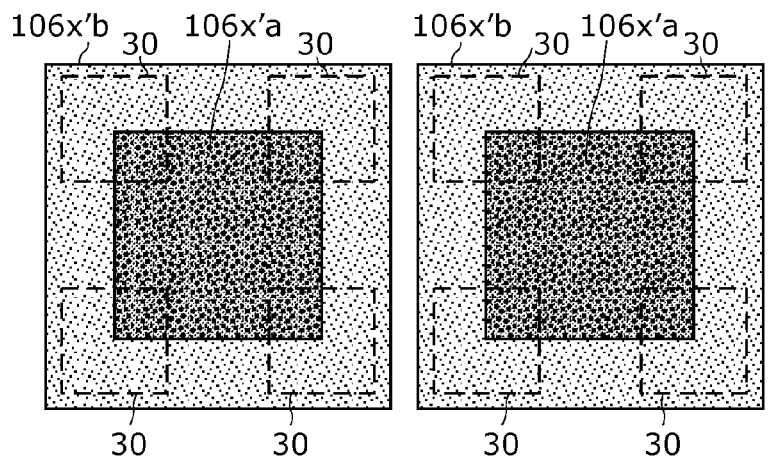

ent whose resistance value changes reversibly upon application of an electric pulse, and to a method of manufacturing such a nonvolatile memory device.

METHOD OF MANUFACTURING A NONVOLATILE MEMORY DEVICE HAVING A VARIABLE RESISTANCE ELEMENT WHOSE RESISTANCE VALUE CHANGES REVERSIBLY UPON APPLICATION OF AN ELECTRIC PULSE

TECHNICAL FIELD

The present invention relates to a variable resistance nonvolatile memory device including a variable resistance element whose resistance value changes reversibly upon application of an electric pulse, and to a method of manufacturing such a nonvolatile memory device.

BACKGROUND ART

Recent years have seen increasing high performance in electronic devices such as mobile information devices and information appliances following the development of digital technology. With the increased high performance in these electronic devices, miniaturization and increase in speed of semiconductor memory devices used are rapidly advancing. In particular, application of semiconductor memory devices to large-capacity nonvolatile memories, typified by flash memory, is expanding at a rapid pace. Additionally, as next-generation new nonvolatile memories having a potential to replace flash memory, a resistive random access memory (ReRAM) using variable resistance elements has been researched and developed.

Here, variable resistance element refers to an element which has a property in which a resistance state (resistance value) reversibly changes according to an electrical signal, and is capable of maintaining a resistance state. The variable resistance element is capable of storing information in a nonvolatile manner by allocating information to each resistance state. More specifically, it is possible to store two values by allocating a value of 0 to one of a low resistance state in which the resistance value is relatively low and a high resistance state in which the resistance value is higher than the low resistance state, and a value of 1 to the other, for example.

A conventional variable resistance element includes a variable resistance layer, in which two variable resistance materials having different degrees of oxygen deficiency are stacked, is formed between a first electrode and a second electrode. Applying an electric pulse (for example, a voltage pulse) between the first electrode and the second electrode of the variable resistance element causes the resistance state to change from a high resistance state to a low resistance state, or from a low resistance state to a high resistance state.

In this type of variable resistance memory, it is preferable that the two values assigned to the low and high resistance states can be definitively distinguished, and that the change between the low resistance state and the high resistance state occur in a rapid and stable manner.

As one example of such a variable resistance element, a nonvolatile memory device including a first electrode, a variable resistance layer configured of a transition metal oxide stacked structure, and a second electrode has been proposed (for example, see Patent Literature (PTL) 1). For example, Patent Literature (PTL) 1 discloses that variation in resistance is stabilized by causing oxidation-reduction reactions to occur at the electrode interface in contact with the variable resistance region high in oxygen content atomic percentage.

CITATION LIST

Patent Literature

[PTL 1] International Publication No. 2008/149484

SUMMARY OF INVENTION

Technical Problem

After manufacturing, the variable resistance element requires initial breakdown processing in which an initial breakdown voltage is applied to the variable resistance element to allow the layer configured of a plurality of stacked variable resistance materials (variable resistance material layer, metal oxide layer) having different degrees of oxygen deficiency to function as variable resistance layer capable of transitioning between high and low resistance states.

Application of this initial breakdown voltage puts the variable resistance element in a state which allows it to transition reversibly between the high and low resistance states. More specifically, when the this initial breakdown voltage is applied, a portion of the variable resistance material layer among the plurality of variable resistance material layers that has a low oxygen deficiency and indicates a high resistance value locally shorts (breaks down), thereby forming a conductive path (filament) and putting the variable resistance element in a state which allows for resistance to vary. The voltage value of the this initial breakdown voltage is typically greater than the voltage value of the voltage pulse applied for changing the low resistance state of the variable resistance layer in normal operation of the nonvolatile memory device.

However, there is a problem with the above-described conventional nonvolatile memory device in that the initial breakdown voltage is high.

The present invention provides a nonvolatile memory device that includes a variable resistance element having a variable resistance layer of stacked variable resistance materials having different degrees of oxygen deficiency, and on which a reduced initial breakdown voltage can be used. Additionally, the present invention provides a method of manufacturing such a nonvolatile memory device on which a reduced initial breakdown voltage can be used.

Solution to Problem

In order to achieve the aforementioned goal, a nonvolatile memory device according to the present invention includes: a first electrode; a first variable resistance layer including a low oxygen concentration region and a high oxygen concentration region, the low oxygen concentration region having contact with the first electrode and comprising a first metal oxide, and the high oxygen concentration region having contact with the low oxygen concentration region, separated from the first electrode by the low oxygen concentration region, and comprising a second metal oxide having a degree of oxygen deficiency lower than a degree of oxygen deficiency of the first metal oxide; a second variable resistance layer having contact with both the low oxygen concentration region and the high oxygen concentration region in a same plane and comprising a third metal oxide having a degree of oxygen deficiency lower than the degree of oxygen deficiency of the first metal oxide; and a second electrode having contact with the second variable resistance layer.

In order to achieve the aforementioned goal, a method of manufacturing a nonvolatile memory device according to the present invention includes: forming a first electrode; forming, above the first electrode, a metal oxide material layer comprising a first metal oxide; forming a mask above a portion of a main surface of the metal oxide material layer; forming, in a region of the metal oxide material layer not covered by the mask, a high oxygen concentration region comprising a second metal oxide having a degree of oxygen deficiency lower than a degree of oxygen deficiency of the first metal oxide; removing the mask; forming, above a first variable resistance layer including the high oxygen concentration region and a low oxygen concentration region, a second variable resistance layer comprising a third metal oxide having a degree of oxygen deficiency lower than the degree of oxygen deficiency of the first metal oxide, the low oxygen concentration region being a region of the metal oxide material layer other than the high oxygen concentration region; and forming a second electrode above the second variable resistance layer.

Advantageous Effects of Invention

The initial breakdown voltage can be reduced with the nonvolatile memory device according to the present invention.

BRIEF DESCRIPTION OF DRAWINGS

FIG. 13A is a planar view illustrating a process in a first method of manufacturing the nonvolatile memory device according to Embodiment 3.

FIG. 13B is a planar view illustrating a process in a first method of manufacturing the nonvolatile memory device according to Embodiment 3.

FIG. 13C is a planar view illustrating a process in a first method of manufacturing the nonvolatile memory device according to Embodiment 3.

DESCRIPTION OF EMBODIMENTS

Figure 1:
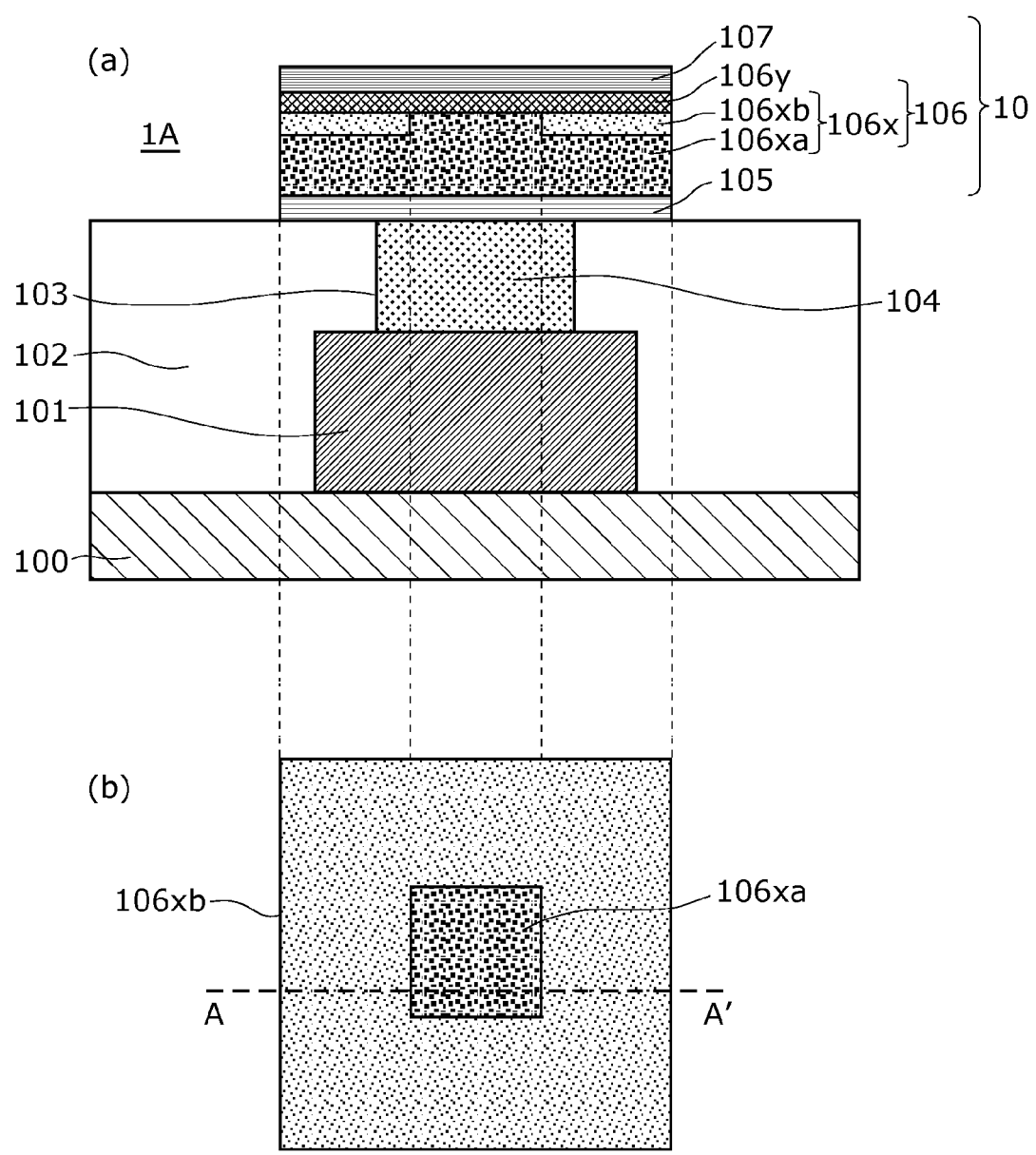
FIG. 1 shows cross sectional and planar views of an example of a configuration of the nonvolatile memory device according to Embodiment 1.

Outline of the Nonvolatile Memory Device and the Manufacturing Method of the Same An aspect of the method of manufacturing a nonvolatile memory device according to the present invention includes: forming a first electrode; forming, above the first electrode, a metal oxide material layer comprising a first metal oxide; forming a mask above a portion of a main surface of the metal oxide material layer; forming, in a region of the metal oxide material layer not covered by the mask, a high oxygen concentration region comprising a second metal oxide having a degree of oxygen deficiency lower than a degree of oxygen deficiency of the first metal oxide; removing the mask; forming, above a first variable resistance layer including the high oxygen concentration region and a low oxygen concentration region, a second variable resistance layer comprising a third metal oxide having a degree of oxygen deficiency lower than the degree of oxygen deficiency of the first metal oxide, the low oxygen concentration region being a region of the metal oxide material layer other than the high oxygen concentration region; and forming a second electrode above the second variable resistance layer.

With the method of manufacturing a nonvolatile memory device according to the present invention, since it is possible to intentionally set a region capable of being broken down in accordance with the mask dimensions, it is possible to reduce irregularities in initial breakdown voltage.

Moreover, for example, in the method of manufacturing a nonvolatile memory device according to an aspect of the present invention, in the forming of a high oxygen concentration region, the region of the metal oxide material layer not covered by the mask is oxidized.

Moreover, for example, the forming of a high oxygen concentration region and the removing of the mask may be performed concurrently.

With this configuration, since it is possible to reduce the overall number manufacturing processes for manufacturing the nonvolatile memory device, it is possible to reduce manufacturing time and cost.

Moreover, for example, the forming of a second variable resistance layer may be performed by a reactive sputtering method in an oxygen atmosphere.

With this configuration, since it is possible to make the film density of the second variable resistance layer smaller than the film density of the high oxygen concentration region formed by an oxidation process, it is possible to realize a reduced initial breakdown voltage for the variable resistance element.

Moreover, for example, the forming of a second variable resistance layer may be performed immediately following the forming of a high oxygen concentration region and the removing of the mask, using a device that concurrently performs the forming of a high oxygen concentration region and the removing of the mask.

With this configuration, since it is possible to reduce the overall number manufacturing processes for manufacturing the nonvolatile memory device, it is possible to greatly reduce manufacturing time and cost.

Moreover, for example, when a plurality of variable resistance elements each including the first electrode, the first variable resistance layer, the second variable resistance layer, and the second electrode are to be formed, in the forming of a mask, the mask may be formed to be shared by a plurality of neighboring ones of the variable resistance elements.

With the method of manufacturing the nonvolatile memory device having the above configuration, since the mask if formed to be shared by a plurality of the variable resistance elements, this is advantageous from the perspective of miniaturization. Furthermore, a cost-effective mask can be used when the mask is to be shared by a plurality of variable resistance elements, thereby contributing to a reduction in manufacturing costs.

Moreover, for example, in the forming of a high oxygen concentration region, the high oxygen concentration region may be formed to have a film thickness smaller than a film thickness of the metal oxide material layer.

Figure 8A:
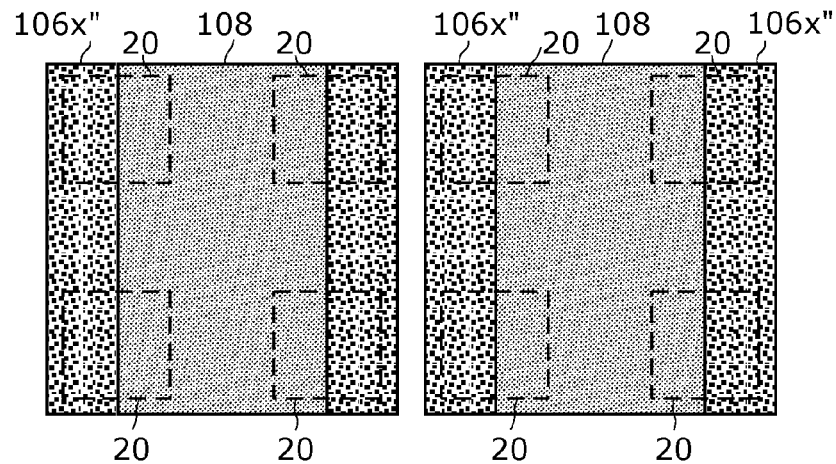
FIG. 8A is a planar view illustrating a process in a first method of manufacturing the nonvolatile memory device according to Embodiment 2.
Figure 8B:
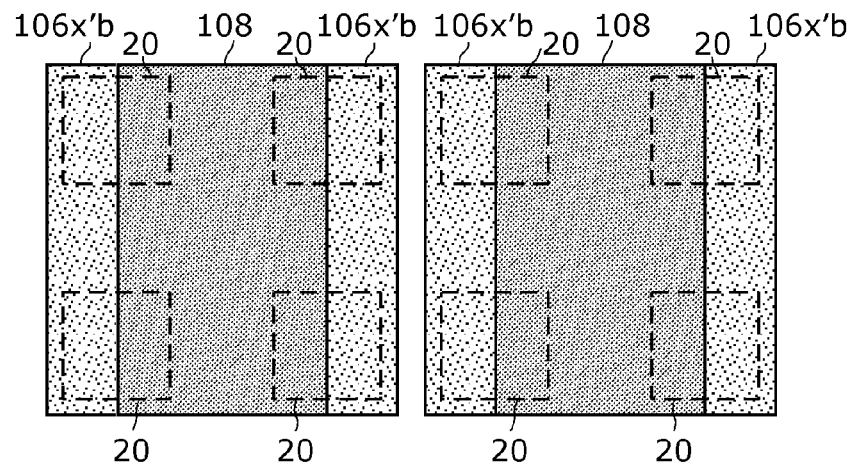
FIG. 8B is a planar view illustrating a process in a first method of manufacturing the nonvolatile memory device according to Embodiment 2.
Figure 8C:
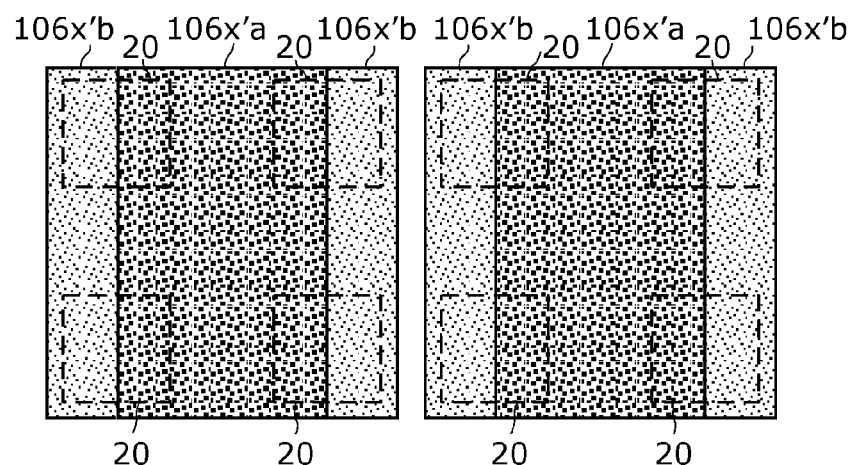
FIG. 8C is a planar view illustrating a process in a first method of manufacturing the nonvolatile memory device according to Embodiment 2.

It should be noted that with the method of manufacturing a nonvolatile memory device having the above configuration, when, for example, a memory cell array in which a plurality of variable resistance elements are arranged in an array in rows and columns is formed, a strip shaped mask to be shared by two rows of the variable resistance element may be formed (see FIG. 8A through FIG. 8C). Alternatively, when the above-described memory cell is formed, by forming a rectangular shaped mask to be shared by four variable resistance elements arranged in a two-by-two pattern and arranging the mask so that the four corners thereof are each near the center of one of the variable resistance elements (see FIG. 13A through FIG. 13C), it is possible to further narrow the region capable of being broken down, thus making it possible to further reduce the initial breakdown voltage and thereby reduce irregularities between elements.

An aspect of the nonvolatile memory device according to the present invention includes: a first electrode; a first variable resistance layer including a low oxygen concentration region and a high oxygen concentration region, the low oxygen concentration region having contact with the first electrode and comprising a first metal oxide, and the high oxygen concentration region having contact with the low oxygen concentration region, separated from the first electrode by the low oxygen concentration region, and comprising a second metal oxide having a degree of oxygen deficiency lower than a degree of oxygen deficiency of the first metal oxide; a second variable resistance layer having contact with both the low oxygen concentration region and the high oxygen concentration region in a same plane and comprising a third metal oxide having a degree of oxygen deficiency lower than the degree of oxygen deficiency of the first metal oxide; and a second electrode having contact with the second variable resistance layer, wherein when viewed from a direction perpendicular to a main surface of the first variable resistance layer, an outer perimeter of the high oxygen concentration region and an outer perimeter of the first variable resistance layer have a point of tangency.

In other words, the nonvolatile memory device having the above configuration includes: a first variable resistance layer including a low oxygen concentration region comprising a first metal oxide and formed above the first electrode and a high oxygen concentration region comprising a second metal oxide having a degree of oxygen deficiency lower than a degree of oxygen deficiency of the first metal oxide, having bottom surface in contact with the low oxygen concentration region and having a top surface that is in a same plane with a top surface of the low oxygen concentration region; a second variable resistance layer formed above the first variable resistance layer and having contact with the low oxygen concentration region and the high oxygen concentration region, and comprising a third metal oxide having a degree of oxygen deficiency lower than the degree of oxygen deficiency of the first metal oxide; and a second electrode formed above and having contact with the second variable resistance layer.

With the nonvolatile memory device having the above configuration, since the variable resistance element includes a high oxygen concentration region in the first variable resistance layer, it is possible to narrow the region capable of being broken down in the second variable resistance layer (the region in which it is possible to form a conductive path). This makes it possible for a reduced initial breakdown voltage to be used. It should be noted that a region capable of being broken down typically refers to a region in the second variable resistance layer other than the region between the high oxygen concentration region and the second electrode.

More specifically, it is difficult if not impossible to form a conductive path in the region of contact between the second variable resistance layer and the high oxygen concentration region, just as when the thickness of the second variable resistance layer is increased. On the other hand, it is possible to form a conductive path in the region of contact between the second variable resistance layer and the low oxygen concentration region. With this, the surface area of the region in the second variable resistance layer capable of being broken down can be reduced.

Furthermore, the current density of the current flowing through the narrowed region in the second variable resistance layer increases beyond the current density of the current flowing through the second variable resistance layer of a conventional variable resistance element. The conductive path becomes easier to form as the current density increases. With this, it is possible to reduce the initial breakdown voltage since the region capable of being broken down in the second variable resistance layer is narrowed due to the formation of the high oxygen concentration region in the first variable resistance layer.

Furthermore, with the nonvolatile memory device having the above configuration, it is possible to form the high oxygen concentration region with a simple manufacturing process by, for example, forming a mask on the first variable resistance layer and oxidizing the surface layer portion (main surface) of the first variable resistance layer. In other words, it is possible to narrow the region of the second variable resistance layer capable of being broken down without using an etching process, and thereby reduce irregularities in initial breakdown voltage of elements.

Moreover, for example, when viewed from the direction perpendicular to the main surface of the first variable resistance layer, an outer perimeter of the low oxygen concentration region and the outer perimeter of the first variable resistance layer do not necessarily have a point of tangency.

The variable resistance element is usually formed by first stacking a first electrode material for forming the first electrode, a variable resistance material for forming the variable resistance layer, and a second electrode material for forming the second electrode, then patterning this stack by etching, but there are times when the side surfaces of the variable resistance element are damaged during this patterning process. With the nonvolatile memory device having the above configuration, it is possible to form the low oxygen concentration region in the first variable resistance layer so that it does not share a point of tangency with the outer perimeter of the main surface of the first variable resistance layer—that is to say—so it does not include a region damaged by etching. In other words, with the nonvolatile memory device having the above configuration, it is possible to narrow down the region in the second variable resistance layer capable of being broken down to a region that does not include a region damaged by etching. With this, it is possible to reduce irregularities in initial breakdown voltage of elements.

Furthermore, with the nonvolatile memory device having the above configuration, the second metal oxide in the first variable resistance layer does not include a surface in contact with the first electrode, and as such, it is possible to secure a larger low oxygen concentration region in the first variable resistance layer, which functions as an oxygen reservoir below the conductive path. As a result, the current characteristics in the low resistance state stabilize, and the resistance characteristics in the high and low resistance states stabilize. As such, a stable memory characteristic can be achieved since irregularities in variable resistance characteristics between bits are reduced (since malfunctions are reduced).

Moreover, it is possible to reduce irregularities in the surface area of the region capable of being broken down arising from irregularities in manufacturing processes, such as alignment irregularities.

Moreover, for example, when viewed from the direction perpendicular to the main surface of the first variable resistance layer, a boundary between the low oxygen concentration region and the high oxygen concentration region may traverse the first variable resistance layer.

Moreover, for example, when viewed from the direction perpendicular to the main surface of the first variable resistance layer, the boundary between the low oxygen concentration region and the high oxygen concentration region may have one corner.

Moreover, for example, the nonvolatile memory device may further include a diode element connected to one of the first electrode and the second electrode.

Generally, in nonvolatile memory devices having memory cells in which the variable resistance element and the diode element are connected in series, the voltage value of the initial breakdown voltage is a sum of the voltage value of the voltage distributed to the variable resistance element and the voltage value of the voltage distributed to the diode element. In other words, since the voltage value of the initial breakdown voltage is greater than when variable resistance element is a single body, the demand for a reduced voltage is even higher. With the nonvolatile memory device having the above configuration, it is possible to reduce the voltage value of the voltage applied to the memory cells since a reduction in the initial breakdown voltage of the variable resistance element is possible. Moreover, it is possible to reduce the transient current that flows at the time of breakdown since the breakdown of the variable resistance element occurs locally. This makes it possible to sufficiently prevent the diode element from breaking down.

Moreover, for example, a first metal included in the first metal oxide and a second metal included in the second metal oxide may be a same metal.

Moreover, for example, the high oxygen concentration region may be formed by oxidizing a region of a metal oxide material layer comprising the first metal oxide.

Moreover, for example, the first metal oxide, the second metal oxide, and the third metal oxide may each be selected from the group consisting of a transition metal oxide and an aluminum oxide.

Moreover, for example, a first metal included in the first metal oxide, a second metal included in the second metal oxide, and a third metal included in the third metal oxide may each be selected from the group consisting of tantalum, hafnium, and zirconium.

When materials including tantalum, hafnium, and zirconium are used as variable resistance materials, retention characteristics (resistance state retention characteristics) are good, and allow for faster than normal resistance changing operations to be performed. These materials provide a substantially stable breakdown characteristic in the initial breakdown operation, and by using these materials as the variable resistance materials, it is possible to stabilize the initial breakdown operation performed on the variable resistance elements.

Moreover, for example, a first metal included in the first metal oxide and a second metal included in second metal oxide may be a same metal, and the first metal included in the first metal oxide and a third metal included in the third metal oxide may be a different metal.

Moreover, for example, the third metal oxide may have a permittivity greater than a permittivity of the first metal oxide.

As FIG. 1 in J. McPherson et al., IEDM 2002, p. 633-636 (Non Patent Literature) shows, the correlation between the breakdown strength and the permittivity of the oxidized layer is such that the breakdown strength decreases with increasing permittivity. As such, with the nonvolatile memory device having the above configuration, a reduced initial breakdown voltage for the variable resistance elements can be realized.

Moreover, for example, the third metal oxide may have a band gap smaller than a band gap of the first metal oxide.

As FIG. 2 in J. McPherson et al., IEDM 2002, p. 633-636 shows, the correlation between the breakdown strength and the band gap of the oxidized layer is such that the breakdown strength increases with increasing band gap. As such, with the nonvolatile memory device having the above configuration, a reduced initial breakdown voltage for the nonvolatile memory device can be realized.

Moreover, for example, a first metal included in the first metal oxide, a second metal included in second metal oxide, and a third metal included in the third metal oxide may be a same metal.

With the nonvolatile memory device having the above configuration, due to the ease of the metal included in the variable resistance material to oxidize—that is to say, since the standard electrode potential is equal—after breakdown, oxidation and reduction reactions occur upon application of a positive and negative voltage, whereby stabilized resistance changing operations are achievable.

Moreover, for example, a plurality of variable resistance elements each including the first electrode, the first variable resistance layer, the second variable resistance layer, and the second electrode may be arranged in an array.

EXPLANATION OF TERMS, ETC

The phrase "degree of oxygen deficiency" in the present Description refers to a rate of deficiency in oxygen of a metal oxide to stoichiometric composition of the metal oxide (when a plurality of stoichiometric ratios is applicable to the metal oxide, stoichiometric composition which provides the metal oxide with the highest resistance value). A metal oxide having a stoichiometric composition is more stable and has a higher resistance value than a metal oxide having a non-stoichiometric composition.

For example, in the case of the metal tantalum (Ta), the composition can be expressed as $TaO_{2.5}$ since the stoichiometric oxide composition, as defined above, is $Ta_2O_5$. The degree of oxygen deficiency of $TaO_{2.5}$ is 0%, so the degree of oxygen deficiency of $TaO_{1.5}$ is 40% ((2.5−1.5)/2.5=40%). The degree of oxygen deficiency of a metal oxide in excess of oxygen is represented as a negative value. It should be noted within the present Specification, unless otherwise noted, the degree of oxygen deficiency includes positive values, 0, and negative values.

An oxide having a low degree of oxygen deficiency has a high resistance value since it is closer to an oxide having a stoichiometric composition, and an oxide having a high degree of oxygen deficiency has a low resistance value since it is closer to a metal comprising an oxide.

The phrase "oxygen content atomic percentage" is the ratio of the number of oxygen atoms to the total number of atoms. For example, the oxygen content atomic percentage of $Ta_2O_5$ is 71.4 atm %, which is the ratio of the number of oxygen atoms to the total number of atoms (O/(Ta+O)). Accordingly, oxygen-deficient tantalum oxide has an oxygen content atomic percentage greater than 0 atm % and less than 71.4 atm %. For example, when the metal included in the first metal oxide and the metal included in the second metal oxide comprise the same constituent metal, the oxygen content atomic percentages and the degree of oxygen deficiency correspond to each other such that when the second metal oxide has an oxygen content atomic percentage larger than the oxygen content atomic percentage of the first metal oxide, the second metal oxide has a degree of oxygen deficiency lower than the degree of oxygen deficiency of the first metal oxide.

An oxygen-deficient metal oxide (preferably oxygen-deficient Ta oxide), for example, is used for the material in the variable resistance layer. The term "oxygen-deficient transition metal oxide" refers to an oxide whose oxygen content (atomic ratio: ratio of number of oxygen atoms to total number of atoms) is less than an oxide having a stoichiometric composition. An oxide having a stoichiometric composition is usually an insulator or has a substantially high resistance value. For example, when the transition metal is Ta, the formula of the stoichiometric oxide compound is $Ta_2O_5$ since the atomic ratio of O to Ta (O/Ta) is 2.5. Accordingly, oxygen-deficient tantalum oxide has a O/Ta atomic ratio of greater than 0 and less than 2.5. In the embodiments of the present Description, the oxygen-deficient transition metal oxide is preferably an oxygen-deficient Ta oxide. More preferably, the variable resistance layer at least has a stacked structure in which a first tantalum-containing layer having a composition expressed as $TaO_x$ (where $0<x<2.5$) and a second tantalum-containing layer having a composition expressed as $TaO_y$ (where $x<y$) are stacked. It goes without saying that other layers, such as a third tantalum-containing layer or a layer comprising a different transition metal oxide, may also be deposited appropriately. Here, in order to achieve a stable operating variable resistance element, it is preferable that $TaO_x$ satisfies $0.8 \le x \le 1.9$ and $TaO_y$ satisfies $2.1 \le y \le 2.5$. Additionally, it is preferable that the second tantalum-containing layer have a thickness no less than 1 nm and no more than 8 nm.

A "metal oxide having a stoichiometric composition" refers to a metal oxide having a degree of oxygen deficiency of 0%. For example, in the case of tantalum oxide, this refers to the insulator $Ta_7O_5$. It should be noted that by being oxygen deficient, the metal oxide is conductive. An oxide having a low degree of oxygen deficiency has a high resistance value since it is closer to an oxide having a stoichiometric composition, and an oxide having a high degree of oxygen deficiency has a low resistance value since it is closer to a metal comprising an oxide. More specifically, in the case of the metal tantalum (Ta), since the stoichiometric composition there of the metal oxide there of is $Ta_7O_5$, this is expressed as $TaO_{2.5}$. $TaO_{2.5}$ has a degree of oxygen deficiency of 0%. For example, the degree of oxygen deficiency of $TaO_{1.5}$, an oxygen-deficient tantalum oxide, is 40% ($(2.5-1.5)/2.5=40\%$). In contrast, the oxygen content atomic percentage is, as described above, a ratio of the number of oxygen atoms to total number of atoms in the metal oxide. The oxygen content atomic percentage of $Ta_7O_5$ is 71.4 atm %, which is the ratio of the number of oxygen atoms to the total number of atoms (O/(Ta+O)). Accordingly, oxygen-deficient tantalum oxide has an oxygen content atomic percentage greater than 0 atm % and less than 71.4 atm %. It should be noted that when the metal included in the first metal oxide and the metal included in the second metal oxide comprise the same constituent metal, it is possible to refer to the magnitude relationship of the degree of oxygen deficiency in terms of oxygen content atomic percentage. For example, when the first metal oxide has a degree of oxygen deficiency greater than the degree of oxygen deficiency of the second metal oxide, the first metal oxide has an oxygen content atomic percentage lower than the oxygen content atomic percentage of the second metal oxide.

The term "standard electrode potential" is generally one index of oxidizability, and a higher standard electrode potential indicates a higher tendency to be oxidized while a lower standard electrode potential indicates a lower tendency to be oxidized. It should be noted that the greater the difference in standard electrode potential of an electrode and a low oxygen deficiency layer having a low degree of oxygen deficiency (the second variable resistance layer), the easier oxidation-reduction reactions and changes in resistance occur. Moreover, as the difference in standard electrode potential decreases the less easy oxidation-reduction reactions and changes in resistance occur. Accordingly, it is presumed that a high tendency to be oxidized plays a large role in a mechanism of the resistance changing phenomenon.

Here, the term "insulator" is in accordance with the general definition of the word. In other words, a material having a resistivity of $10^8$ Ωcm or higher is defined as an insulator (Non Patent Literature: adapted from "Semiconductor Engineering for Integrated Circuits" Engineering Investigation Committee (1992), Akira Usami, Shinnji Kanefusa, Takao Maekawa, Hajime Tomokage, Morio Inoue), and a material having a resistance value below $10^8$ Ωcm is defined as a conductor. It should be noted that the resistivity of the first metal oxide and the resistivity of the third metal oxide are different by 4 to 6 digits. Moreover, the resistivity of the variable resistance element 10 after the initial breakdown operation is approximately $10^4$ Ωcm.

In the embodiments of the present Description, regarding the above-below (top-bottom) direction, the "top" or "above" direction refers to the direction from the first electrode to the second electrode, while the "bottom" or "below" direction refers to the direction from the second electrode to the first electrode. When the nonvolatile memory device includes a substrate, above or top typically refers to a direction away from the substrate, while bottom or below typically refers to a direction toward the substrate. Moreover, "top surface" refers to a surface of the layer in question that faces toward the second electrode. Conversely, "bottom surface" refers to a surface of the layer in question that faces toward the first electrode. It should be noted that these surfaces are not limited to planar surfaces, and include curved surfaces.

The phrase "in the same plane" is not limited to a flat plane and includes curved planes such as when a gradual curve is formed in the surface by a recess, for example. Additionally, this includes surfaces which have steps in atom layer denominations due to compositional differences and the like.

The term "flat" includes forms having a gradual curve due to a recess, for example, and does not limit to a completely flat form.

Hereinafter, embodiments of the present invention shall be described with reference to the Drawings. It should be noted that each of the exemplary embodiments described below shows one specific example. The numerical values, shapes, materials, structural components, the arrangement and connection of the structural components, steps, the processing order of the steps, etc. shown in the following exemplary embodiments are mere examples, and therefore do not limit the scope of the appended claims and their equivalents. Moreover, among the structural elements in the following exemplary embodiments, structural elements not recited in any one of the independent claims defining the most generic part of the inventive concept are described as structural elements of a preferable embodiment. The constituents designated by the same reference numerals throughout the drawings will not be described repetitively in some cases. In addition, in the drawings, the constituents are schematically depicted for easier understanding. Therefore, the shapes and scales of the constituents are not depicted accurately in some cases. Moreover, in the manufacturing method, when necessary, changes may be made in the order of manufacturing processes and other known processes may be additionally performed.

Embodiment 1

The nonvolatile memory device and method of manufacturing the same according to Embodiment 1 will be described with reference to FIG. 1 through FIG. 5C.

[Element Structure]

First, the structure of a nonvolatile memory device 1A according to Embodiment 1 will be described with reference to FIG. 1. (a) in FIG. 1 shows a cross sectional view of an example of a configuration of the nonvolatile memory device 1A according to Embodiment 1, and corresponds with the line A-A' in (b) in FIG. 1. (b) in FIG. 1 is a planar view when viewed from above the main surface of the first variable resistance layer 106x of the nonvolatile memory device 1A shown in (a) in FIG. 1.

As (a) in FIG. 1 shows, the nonvolatile memory device 1A includes a substrate 100, a bottom layer line 101 formed above the substrate 100, an interlayer insulating layer 102 that covers the surface of the substrate 100 and the bottom layer line 101, a contact plug 104 formed to fill a contact hole 103 which goes through the interlayer insulating layer 102 and reaches the bottom layer line 101, and a variable resistance element 10 formed above the interlayer insulating layer 102.

The variable resistance element 10 includes a first electrode 105 formed above the contact plug 104, a variable resistance layer 106 formed above the first electrode 105, and a second electrode 107 formed above the variable resistance layer 106.

In Embodiment 1, the first electrode 105 comprises tantalum nitride (TaN), which is the first electrode material, and has a film thickness of 50 to 200 nm.

The variable resistance layer 106 has a stacked structure in which a first variable resistance layer 106x and a second variable resistance layer 106y are stacked.

The first variable resistance layer 106x includes a low oxygen concentration region 106xa comprising the first metal oxide and a high oxygen concentration region 106xb comprising the second metal oxide, which has a lower degree of oxygen deficiency than the first metal oxide. The first variable resistance layer 106x has a film thickness of 20 to 100 nm. Moreover, the main surface of the first variable resistance layer 106x (in other words, the surface in contact with the second variable resistance layer 106y and approximately parallel to the substrate 100) is flat. This is because, in the manufacturing process to be described hereinafter, the high oxygen concentration region 106xb is obtained by oxidizing the surface layer portion of the layer comprising the first metal oxide which is the variable resistance material of the low oxygen concentration region 106xa.

The high oxygen concentration region 106xb is formed to have a surface in contact with the second variable resistance layer 106y and to not have a surface in contact with the first electrode 105. In the example shown in (a) in FIG. 1, the bottom surface of the high oxygen concentration region 106xb is in contact with the low oxygen concentration region 106xa, and the top surface of the high oxygen concentration region 106xb is in contact with the second variable resistance layer 106y in the same plane as a portion of the top surface of the low oxygen concentration region 106xa. Furthermore, when viewed from above the main surface like that shown in (b) in FIG. 1, the high oxygen concentration region 106xb according to Embodiment 1 is formed in a loop and has a film thickness (height of the tube) from 2 to 10 nm. It should be noted that the shape of the top surface of the high oxygen concentration region 106xb is not limited to this example, and may be a rectangular shape such as is shown in (b) in FIG. 6.

The low oxygen concentration region 106xa is formed in a region of the variable resistance layer 106 other than the high oxygen concentration region 106xb, and formed to have a surface in contact with the second variable resistance layer 106y and to have a surface in contact with the first electrode 105. A portion of the top surface of the low oxygen concentration region 106xa (the second top surface) is in contact with the second variable resistance layer 106y in the same plane as the top surface of the high oxygen concentration region 106xb, and the other portion of the top surface of the low oxygen concentration region 106xa is in contact with the bottom surface of the high oxygen concentration region 106xb. In other words, the top surface of the low oxygen concentration region 106xa includes a first top surface that is in contact with at least the bottom surface of the high oxygen concentration region 106xb, and a second top surface that is in contact with the second variable resistance layer 106y. The height of the second top surface relative to the first electrode is higher than the height of the first top surface. More specifically, when viewed from above the main surface as (b) in FIG. 1 shows, the low oxygen concentration region 106xa is formed to not have a point of tangency with the outer perimeter of the variable resistance layer 106, but to have a rectangular surface that is smaller than the main surface of the first variable resistance layer 106x. Moreover, the thickness of the low oxygen concentration region 106xa from the first electrode 105 to the surface in contact with the high oxygen concentration region 106xb is 18 to 95 nm.

In Embodiment 1, the first metal oxide included in the low oxygen concentration region 106xa is exemplified as being an oxygen-deficient tantalum oxide (TaO$_x$ where 0<x<2.5). In Embodiment 1, the second metal oxide included in the high oxygen concentration region 106xb is exemplified as being a tantalum oxide having a smaller degree of oxygen deficiency than the first metal oxide (TaO$_y$ where x<y).

The second variable resistance layer 106y has a film thickness of 2 to 10 nm, and comprises a third metal oxide which has a smaller degree of oxygen deficiency than the first metal oxide. In Embodiment 1, the third metal oxide is exemplified as being a tantalum oxide having a smaller degree of oxygen deficiency than the first metal oxide (TaO$_z$ where x<z). It should be noted that in Embodiment 1, the third metal oxide has a resistivity that is greater than the resistivity of the first metal oxide and a band gap that is smaller than the band gap of the first metal oxide.

In Embodiment 1, the second electrode 107 is exemplified as comprising platinum (Pt) as the second electrode material. It should be noted that the second electrode material is not limited to platinum (Pt). The second electrode may comprise a material having a higher standard electrode potential than the material included in the first electrode and the metal included in the second metal oxide, such as platinum (Pt), iridium (Ir), or palladium (Pd).

Moreover, the first electrode may comprise a material having a lower standard electrode potential than the metal included in the first metal oxide, such as tungsten (W), nickel (Ni), tantalum (Ta), titanium (Ti), aluminum (Al), tantalum nitride (TaN), or titanium nitride (TiN). The higher the standard electrode potential, the less a metal tends to oxidize.

In other words, between a standard electrode potential V2 of the second electrode, a standard electrode potential Vr3 of the metal included in the third metal oxide, a standard electrode potential Vr1 of the metal included in the first metal oxide, and a standard electrode potential V1 of the first electrode, the relationships Vr3<V2 and V1<V2 may be satisfied. Furthermore, the relationships V2>Vr3 and Vr1≥V1 may be satisfied.

With the above configuration, an oxidation-reduction reaction selectively occurs in the second metal oxide at the vicinity of the interface between the second electrode and the second metal oxide, and a stable resistance changing phenomenon occurs.

With this kind of configuration, an oxidation-reduction reaction selectively occurs in the second variable resistance layer 106y at the vicinity of the interface between the second electrode 107 and the second variable resistance layer 106y, and a stable resistance changing phenomenon occurs.

More specifically, it is conceivable that the resistance changing phenomenon that occurs in the variable resistance layer 106 of the variable resistance element 10 in normal operation does so due to oxidation and reduction reactions occurring in the fine filament formed inside the third metal oxide included in the second variable resistance layer 106y. In other words, it is conceivable that the oxygen ions inside the variable resistance layer 106 are drawn to the side of the second variable resistance layer 106y causing oxidation reactions to occur in the fine filament formed inside the second variable resistance layer 106y and thereby increasing the resistance of the fine filament when a positive voltage is applied, with reference to the first electrode 105, to the second electrode 107 connected to the second variable resistance layer 106y. Conversely, it is conceivable that the oxygen ions inside the second variable resistance layer 106y are pushed to the side of the first variable resistance layer 106x causing reduction reactions to occur in the fine filament formed inside the second variable resistance layer 106y and thereby decreasing resistance of the fine filament when a negative voltage is applied, with reference to the first electrode 105, to the second electrode 107 connected to the second variable resistance layer 106y.

Moreover, since the nonvolatile memory device 1A according to Embodiment 1 has a configuration which narrows the region capable of being broken down in the second variable resistance layer 106y with the high oxygen concentration region 106xb, the current density flowing through the region capable of being broken down is higher than the current density flowing through the region capable of being broken down in a conventional variable resistance element. This makes it possible for a reduced initial breakdown voltage to be used, based on the narrowed region.

Furthermore, in the nonvolatile memory device 1A according to Embodiment 1, the region capable of being broken down is formed so as not to have a point of tangency with the outer perimeter of the variable resistance layer 106. In the manufacturing of the nonvolatile memory device 1A, there are times when the side surfaces of the variable resistance element 10 are damaged during the etching processes for patterning each material included in the variable resistance element 10, but in the nonvolatile memory device 1A according to Embodiment 1, in the top surface view, the outer perimeter of the high oxygen concentration region 106xb and the outer perimeter of the first variable resistance layer 106x match. In other words, the region capable of being broken down does not share a point of tangency with the outer perimeter—that is to say, it is designed to be in a region distanced from the side walls of the variable resistance element 10, which easily receive etching damage—and as such, it is possible to reduce irregularities in initial breakdown voltage.

Furthermore, in the nonvolatile memory device 1A according to Embodiment 1, since the second high oxygen concentration region 106xb in the first variable resistance layer 106x does not have a surface in contact with the first electrode 105, it is possible to secure a larger low oxygen concentration region 106xa in the first variable resistance layer 106x, which functions as an oxygen reservoir below the conductive path. As a result, the current characteristics in the low resistance state stabilize, and the resistance characteristics in the high and low resistance states stabilize. As such, a stable memory characteristic can be achieved since irregularities in variable resistance characteristics between bits are reduced (since malfunctions are reduced).

It should be noted that in FIG. 1, nonvolatile memory device 1A is exemplified as having one variable resistance element 10, but the nonvolatile memory device 1A typically includes a plurality of the variable resistance elements 10 shown in FIG. 1. More specifically, the nonvolatile memory device 1A includes a plurality of memory cells arranged in an array, and each memory cell includes the variable resistance element 10.

[First Method of Manufacturing]

An example of the first method of manufacturing the nonvolatile memory device 1A according to Embodiment 1 will be described with reference to FIG. 2A through FIG. 2J and FIG. 3A through FIG. 3C. It should be noted that hereinafter, the nonvolatile memory device 1A will be described in the case that it is equipped with a plurality of the variable resistance elements 10 shown in FIG. 1.

FIG. 2A through FIG. 2J are cross sectional views illustrating configurations of the main portion of the nonvolatile memory device 1A in each process in the first method of manufacturing according to Embodiment 1. Moreover, FIG. 3A through FIG. 3C are planar views from above, and correspond to FIG. 2E through FIG. 2G.

Figure 2A:
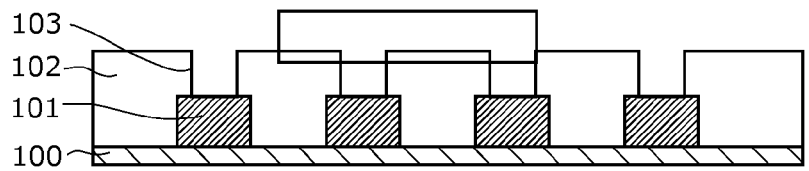
FIG. 2A is a cross sectional view illustrating a process in a first method of manufacturing the nonvolatile memory device according to Embodiment 1.
Figure 3A:
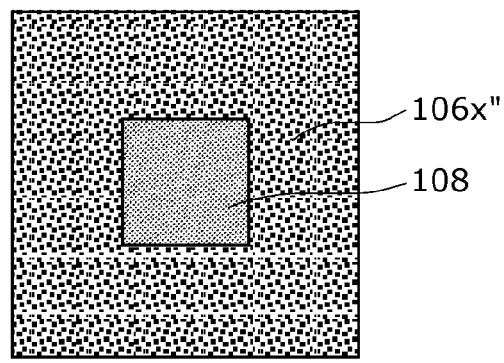
FIG. 3A is a planar view illustrating a process in a first method of manufacturing the nonvolatile memory device according to Embodiment 1.
Figure 3B:
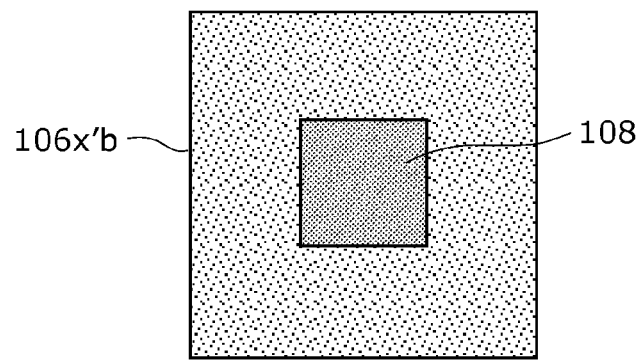
FIG. 3B is a planar view illustrating a process in a first method of manufacturing the nonvolatile memory device according to Embodiment 1.
Figure 3C:
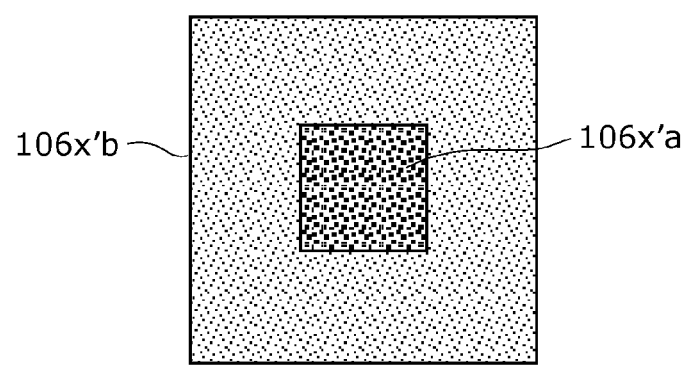
FIG. 3C is a planar view illustrating a process in a first method of manufacturing the nonvolatile memory device according to Embodiment 1.

First, as FIG. 2A shows, a line material comprising aluminum is deposited to have a film thickness of 400 to 600 nm above the substrate 100, which includes transistors and such, and the material is patterned to form the bottom layer line 101.

Additionally, an insulating material is deposited to cover the surfaces of the bottom layer line 101 and the substrate 100 and to have a film thickness of 500 to 1000 nm, and the surface thereof is planarized to form the interlayer insulating layer 102. It should be noted that material for the insulating material included in the interlayer insulating layer 102 may be a plasma TEOS film, a fluoride-containing oxide capable of reducing parasitic capacitance between lines (for example, FSG), or low-k material.

Additionally, the contact hole 103 penetrating through the interlayer insulating layer 102 and reaching the bottom layer line 101 is formed by patterning the interlayer insulating layer 102 with a desired mask. Here, the diameter of the contact hole 103 is set to be from 50 to 300 nm. It should be noted that when the width of the bottom layer line 101 is smaller than the diameter of the contact hole 103, the surface area of contact between the bottom layer line 101 and the contact plug 104 may vary between variable resistance elements due to mask misalignment, whereby cell current may vary. In an effort to prevent this, the width of the bottom layer line 101 is preferably set to be larger than the diameter of the contact hole 103.

Figure 2B:
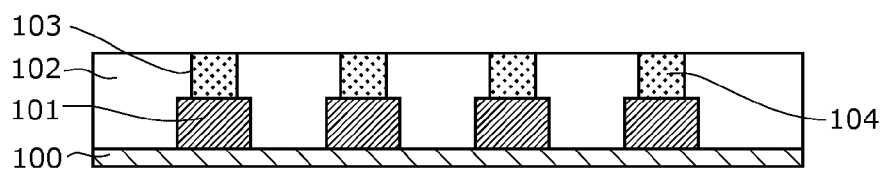
FIG. 2B is a cross sectional view illustrating a process in a first method of manufacturing the nonvolatile memory device according to Embodiment 1.

Next, as FIG. 2B shows, the contact plug 104 is formed to fill the contact hole 103. More specifically, first, titanium nitride (TiN)/titanium (Ti) is deposited by sputtering to have a film thickness of 5 to 30 nm, whereby a bottom layer which functions as an adhesive layer and a diffusion layer.

Next, above the bottom layer, an upper layer is formed by depositing tungsten by CVD to have a film thickness of 200 to 400 nm. As a result, the contact hole 103 is filled with a filler material mainly comprising tungsten. Next, the entire wafer surface is planarized using chemical mechanical polishing (CMP) whereby unwanted filler material is removed from the surface of the interlayer insulating layer 102, and a contact plug 104 is formed in the contact hole 103.

Figure 2C:
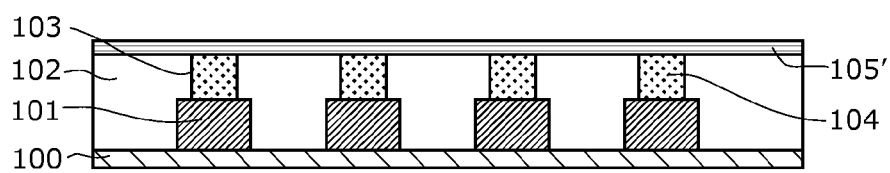
FIG. 2C is a cross sectional view illustrating a process in a first method of manufacturing the nonvolatile memory device according to Embodiment 1.

Next, as FIG. 2C shows, a first conductive film 105' comprising tantalum nitride (TaN), which is the first electrode material of the first electrode 105, is formed above the interlayer insulating layer 102 to cover the contact plug 104. More specifically, the first conductive film 105' is formed by depositing a film of tantalum nitride having a thickness of 50 to 200 nm by sputtering a tantalum target in a gas atmosphere of argon (Ar) and nitride using a reactive sputtering method.

Figure 2D:
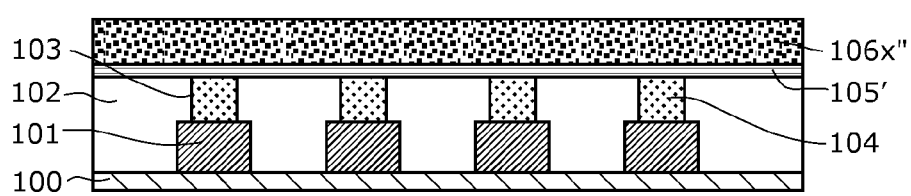
FIG. 2D is a cross sectional view illustrating a process in a first method of manufacturing the nonvolatile memory device according to Embodiment 1.

Next, as FIG. 2D shows, a metal oxide material layer 106x'' is formed (deposited) above the first conductive film 105'. More specifically, here, the metal oxide material layer 106x'' is formed by depositing tantalum oxide (TaO$_x$), which is the first metal oxide, to have a thickness of 20 to 100 nm by sputtering a tantalum target in a gas atmosphere of argon (Ar) and oxygen using a reactive sputtering method. It should be noted that in Embodiment 1, the oxygen content atomic percentage of the first metal oxide TaO$_x$ is set to be 50 to 60 atm %, and the resistivity is set to be 2 to 50 mΩ-cm.

Figure 2E:
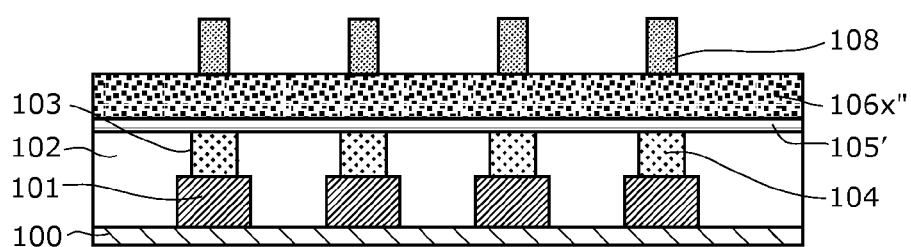
FIG. 2E is a cross sectional view illustrating a process in a first method of manufacturing the nonvolatile memory device according to Embodiment 1.

Next, as FIG. 2E shows, a resist mask 108 is formed above the metal oxide material layer 106x'' using photolithography. Here, since the high oxygen concentration region 106xb is formed in the region of the metal oxide material layer 106x'' not covered by the resist mask 108, the resist mask 108 is formed above the main surface of the metal oxide material layer 106x'' in the region in which the high oxygen concentration region 106xb is not formed (the region in which the low oxygen concentration region 106xa is formed). More specifically, as FIG. 3A shows, the shape of the surface of the resist mask 108 having contact with the metal oxide material layer 106x'' is a smaller rectangular shape than the shape (rectangular) of the variable resistance element 10, and is positioned so it does not have a point of tangency with the outer perimeter of the variable resistance layer 106. This makes it possible to form the filament in a region distanced from the edge portions of the variable resistance element 10, and thereby reduce or eliminate the effect etching damage has thereon.

Figure 2F:
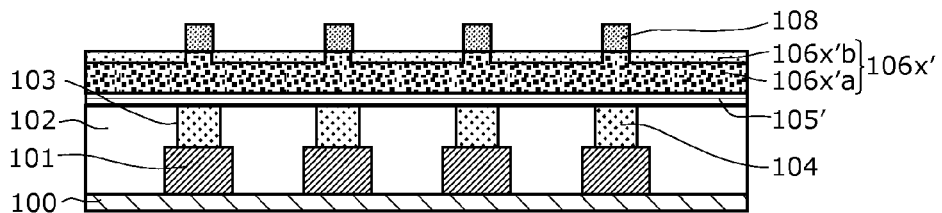
FIG. 2F is a cross sectional view illustrating a process in a first method of manufacturing the nonvolatile memory device according to Embodiment 1.

Next, as FIG. 2F and FIG. 3B show, using a dry etching device, by performing oxidation with plasma generated in gas containing oxygen, a second metal oxide region 106x'b is formed in the region of the metal oxide material layer 106x'' not covered by the resist mask 108. The second metal oxide region 106x'b is formed to have an oxygen content atomic percentage of 65 to 75 atm %, a resistivity of $10^7$ Ω-cm or greater, and a film thickness of 3 to 10 nm. Since the second metal oxide region 106x'b is set to have a film thickness of 3 to 10 nm, it is formed not touching the first conductive film 105'. In other words, the depth of the second metal oxide region 106x'b is not as deep as the film depth of the metal oxide material layer 106x''.

As a result, a first variable resistance film 106x' including the second metal oxide region 106x'b and a first metal oxide region 106x'a, which is the region other than the second metal oxide region 106x'b, is formed. As FIG. 3B shows, when viewed from above the main surface, in the first variable resistance film 106x', the rectangular first metal oxide region 106x'a comprising the first metal oxide is formed in the central region, and the second metal oxide region 106x'b is formed surrounding the first metal oxide region 106x'a. In other words, since the first metal oxide region 106x'a is formed inward of the etching damage region at the outer perimeter region of the variable resistance element 10 in which damage from etching may be received, the influence etching damage has thereon is reduced.

It should be noted that in the first method of manufacturing according to Embodiment 1, since the process for forming the second metal oxide region 106x'b (equivalent to a part of the process for forming the high oxygen concentration region 106xb) does not include processing which changes the thickness of the film such as etching, the main surface of the first variable resistance film 106x' is flat. With this, the film thickness of a second variable resistance film 106y' formed above the first variable resistance film 106x' can be favorably controlled.

Figure 2G:
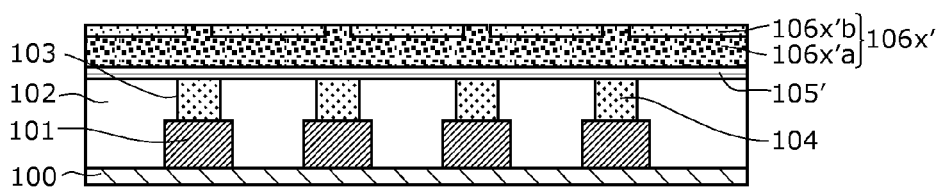
FIG. 2G is a cross sectional view illustrating a process in a first method of manufacturing the nonvolatile memory device according to Embodiment 1.

At this time, as FIG. 2G and FIG. 2F show, the resist mask 108 is thinned. It should be noted that in Embodiment 1, the second metal oxide region 106x'b is described as being formed with an example in which a dry etching device is used to oxidize the surface layer portion of the metal oxide material layer 106x''', but formation thereof is not limited to this example. However, the metal oxide material layer 106x'' may be oxidized using an ashing device, and the metal oxide material layer 106x''' may be plasma oxidized in an atmosphere including oxygen using a plasma oxidizing device to form the second metal oxide region 106x'b.

Next, as FIG. 2G and FIG. 3C show, the thinned resist mask 108 above the first variable resistance film 106x' is removed, and the first metal oxide region 106x'a is exposed to the surface. It should be noted that it is preferable that the removal of the resist mask 108 is performed under the condition that the first metal oxide region 106x'a is difficult to be oxidized. More specifically, in Embodiment 1, the removal of the resist mask 108 is exemplified by wet etching using an ammonia hydrogen peroxide aqueous solution. It should be noted that when the resist mask 108 is removed by wet etching, an extremely thin natural oxide film is formed on the surface of the first metal oxide region 106x'a, but since the film thickness of this natural oxide film is extremely thin compared to the film thickness of the high oxygen concentration region 106xb (the second metal oxide region 106x'b), and furthermore does not exceed the film thickness of the second variable resistance layer 106y, this does not effect the narrowing of the surface area of the region capable of being broken down.

Figure 2H:
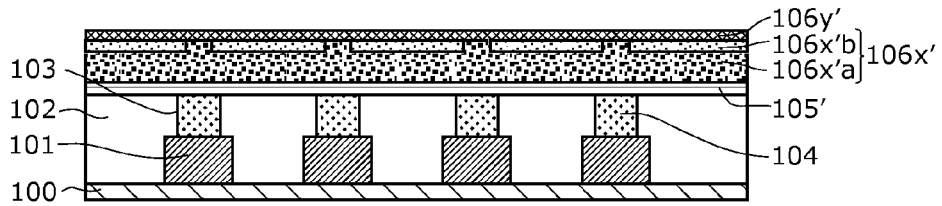
FIG. 2H is a cross sectional view illustrating a process in a first method of manufacturing the nonvolatile memory device according to Embodiment 1.

Next, as FIG. 2H shows, the second variable resistance film 106y' comprising a third transition metal oxide is formed (deposited) above the first variable resistance film 106x'. More specifically, in Embodiment 1, the second variable resistance film 106y' is formed by the so-called reactive sputtering method of sputtering a tantalum target in a gas atmosphere of argon (Ar) and oxygen. The second variable resistance film 106y' is formed to have an oxygen content atomic percentage of 65 to 75 atm %, a resistivity of $10^7$ Ω-cm or greater, and a film thickness of 3 to 10 nm. In other words, the second variable resistance film 106y' has a greater oxygen concentration and greater resistance value than the first metal oxide region 106x'a of the first variable resistance film 106x'.

Figure 2I:
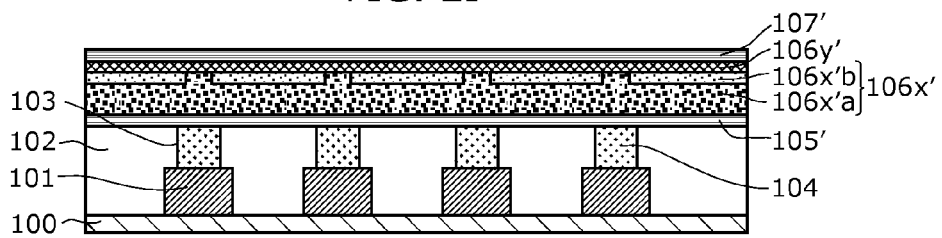
FIG. 2I is a cross sectional view illustrating a process in a first method of manufacturing the nonvolatile memory device according to Embodiment 1.

Next, as FIG. 2I shows, a second conductive film 107' comprising a noble metal (platinum (Pt), iridium (Ir), palladium (Pd), etc.), which is the second electrode material of the second electrode 107, is formed (deposited) above the second variable resistance film 106y'.

Figure 2J:
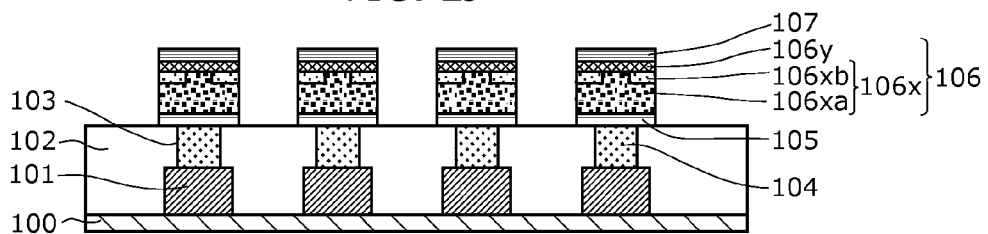
FIG. 2J is a cross sectional view illustrating a process in a first method of manufacturing the nonvolatile memory device according to Embodiment 1.

Next, as FIG. 2J shows, the second conductive film 107', second variable resistance film 106y', first variable resistance film 106x', and first conductive film 105' shown in FIG. 2I are patterned using a desired mask, whereby the variable resistance element 10 is formed. It should be noted that in Embodiment 1, etching is problematic with the noble metal used as the second electrode material, so when used in the second electrode 107, the variable resistance element 10 can be formed by making this into a hard mask. It should be noted that in Embodiment 1, patterning is performed in one batch using the same mask for each layer in the variable resistance element 10, but patterning may be performed for each layer.

As a result, the variable resistance element 10 is formed in which the variable resistance layer 106 configured of the stacked first variable resistance layer 106x and second variable resistance layer 106y is formed between the first electrode 105 and the second electrode 107. It should be noted that, as FIG. 3B shows, when viewed from above the main surface, in the first variable resistance film 106x', the rectangular first metal oxide region 106x'a comprising the first metal oxide is formed in the central region, and the second metal oxide region 106x'b is formed surrounding the first metal oxide region 106x'a. With this, even if the outer perimeter region of the variable resistance element 10 were damaged by etching, since the first metal oxide region 106x'a is formed inward of the etching damage region, the influence etching damage has thereon is reduced. Moreover, it is possible to reduce irregularities in the surface area of the region capable of being broken down arising from irregularities in manufacturing processes, such as alignment irregularities.

By subsequently performing processes such as the process of covering the variable resistance element 10 with an interlayer insulating film, the process of forming a contact plug connected to the second electrode 107 of the variable resistance element 10, and the process of forming a top layer line connected to the contact plug (not shown in the Drawings), the nonvolatile memory device 1A including the variable resistance element 10 according to Embodiment 1 can be formed.

[Second Method of Manufacturing]

An example of the second method of manufacturing the nonvolatile memory device 1A according to Embodiment 1 will be described with reference to FIG. 4A through FIG. 4C and FIG. 3A through FIG. 3C. It should be noted that hereinafter, the nonvolatile memory device 1A will be described in the case that it is equipped with a plurality of the variable resistance elements 10 shown in FIG. 1.

The second method of manufacturing is different from the first method of manufacturing in that the process of forming the second metal oxide region 106x'b shown in FIG. 2F and the process of removing the resist mask 108 shown in FIG. 2G in the first method of manufacturing are performed concurrently.

Figure 4A:
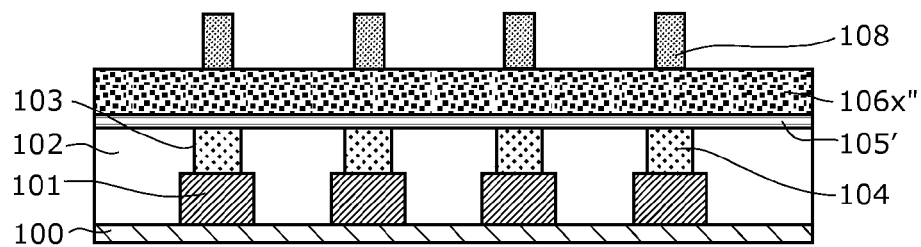
FIG. 4A is a cross sectional view illustrating a process in a second method of manufacturing the nonvolatile memory device according to Embodiment 1.
Figure 4B:
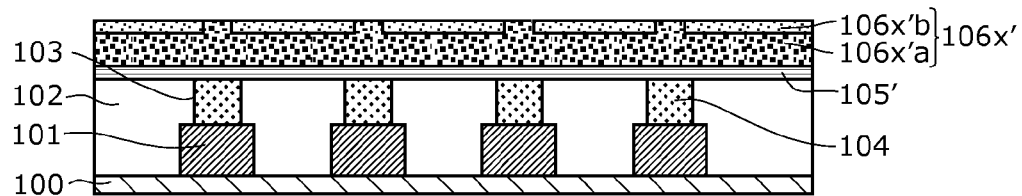
FIG. 4B is a cross sectional view illustrating a process in a second method of manufacturing the nonvolatile memory device according to Embodiment 1.
Figure 4C:
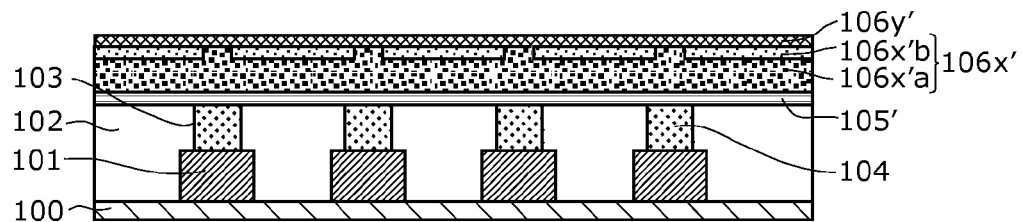
FIG. 4C is a cross sectional view illustrating a process in a second method of manufacturing the nonvolatile memory device according to Embodiment 1.

FIG. 4A through FIG. 4C are cross sectional views illustrating configurations of the main portion of the nonvolatile memory device 1A in each process in the second method of manufacturing. It should be noted that the processes before the process of forming the resist mask 108 shown in FIG. 4A are the same as those shown in FIG. 2A through FIG. 2D, and as such, descriptions thereof are omitted. Moreover, in FIG. 4A through FIG. 4C, the same reference numbers are used for the same structural elements as those in FIG. 2A through FIG. 2J, and as such, descriptions thereof are omitted.

In the second method of manufacturing, firstly, the processes up through the forming of the metal oxide material layer 106x'' shown in FIG. 2A through FIG. 2D are performed using the same methods as in the first method of manufacturing.

Next, as FIG. 4A and FIG. 3A show, a resist mask 108 is formed above the metal oxide material layer 106x'' using photolithography. Here, the shape, measurement, and positioning of the resist mask 108 is the same as that in first method of manufacturing. More specifically, as FIG. 3A shows, the shape of the surface of the resist mask 108 having contact with the metal oxide material layer 106x'' is a smaller rectangular shape than the shape (rectangular) of the variable resistance element 10, and is positioned so it does not have a point of tangency with the outer perimeter of the variable resistance layer 106.

Next, as FIG. 4B shows, using a dry etching device, by performing oxidation with plasma generated in gas containing oxygen, a second metal oxide region 106x'b is formed in the region of the metal oxide material layer 106x''' not covered by the resist mask 108 at the same time as the resist mask 108 is removed whereby the first metal oxide region 106x' a is exposed to the surface. It should be noted that the removable of the resist mask 108 and the formation of the second metal oxide region 106x'b in the second method of manufacturing are performed under a different condition than the formation of the second metal oxide region 106x'b in the first method of manufacturing regarding the plasma oxidation in the dry etching device. At this time, when the variable resistance element 10 is viewed from above, the variable resistance element 10 is as FIG. 3C shows. The second metal oxide region 106x'b is formed to have an oxygen content atomic percentage of 65 to 75 atm %, a resistivity of $10^7$ Ω-cm or greater, and a film thickness of 3 to 10 nm. It should be noted that similar to the first method of manufacturing, the formation of the second metal oxide region 106x'b is not limited to formation by oxidation using a dry etching device, but may be formed by oxidation using an ashing device, or formed by plasma oxidation in an atmosphere including oxygen using a plasma oxidation device.

As a result, a first variable resistance film 106x' including the second metal oxide region 106x'b and a first metal oxide region 106x'a, which is the region other than the second metal oxide region 106x'b, is formed. As FIG. 3C shows, when viewed from above the main surface, in the first variable resistance film 106x', the rectangular first metal oxide region 106x'a comprising the first metal oxide is formed in the central region, and the second metal oxide region 106x'b is formed surrounding the first metal oxide region 106x'a. In other words, since the first metal oxide region 106x'a is formed inward of the etching damage region at the outer perimeter region of the variable resistance element 10 in which damage from etching may be received, the influence etching damage has thereon is reduced.

It should be noted that in the second method of manufacturing, since the processes of forming the second metal oxide region 106x'b and removing the resist mask 108 do not include processing which changes the thickness of the film such as etching, the main surface of the first variable resistance film 106x' is flat. With this, the film thickness of a second variable resistance film 106y' formed above the first variable resistance film 106x' can be favorably controlled.

Next, as FIG. 4C shows, the second variable resistance film 106y' comprising the third metal oxide is formed (deposited) above the first variable resistance film 106x'. More specifically, in the second method of manufacturing, the second variable resistance film 106y' is formed by the so-called reactive sputtering method of sputtering a tantalum target in a gas atmosphere of argon (Ar) and oxygen. The second variable resistance film 106y' is formed to have an oxygen content atomic percentage of 65 to 75 atm %, a resistivity of $10^7$ Ω-cm or greater, and a film thickness of 3 to 10 nm. In other words, the second variable resistance film 106y' has a greater oxygen concentration and greater resistance value than the first metal oxide region 106x'a of the first variable resistance film 106x'.

Next, the process of forming the second conductive film 107' shown in FIG. 2I and the process of patterning the first conductive film 105', the first variable resistance film 106x', the second variable resistance film 106y', and the second conductive film 107' shown in FIG. 2J are performed. This completes the nonvolatile memory device 1A.

In the second method of manufacturing, since the removal of the resist mask 108 and the formation of the second metal oxide region 106x'b are performed concurrently, there is no need to perform an independent processes solely for removing the resist mask 108. As such, the number manufacturing processes performed can be reduced, making it possible to reduce manufacturing costs.

[Third Method of Manufacturing]

An example of the third method of manufacturing the nonvolatile memory device 1A according to Embodiment 1 will be described with reference to FIG. 5A through FIG. 5C and FIG. 3A through FIG. 3C. It should be noted that hereinafter, the nonvolatile memory device 1A will be described in the case that it is equipped with a plurality of the variable resistance elements 10 shown in FIG. 1.

The third method of manufacturing is different from the second method of manufacturing in that (i) the formation of the second metal oxide region 106x'b and the removal of the resist mask 108 (FIG. 4B) and (ii) the formation of the second variable resistance film 106y' (FIG. 4C) are performed consecutively within the same device.

Figure 5A:
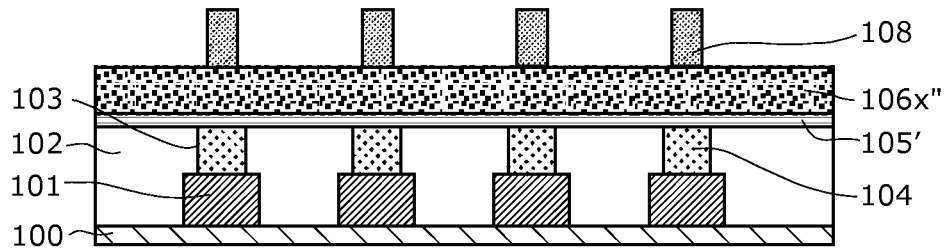
FIG. 5A is a cross sectional view illustrating a process in a third method of manufacturing the nonvolatile memory device according to Embodiment 1.
Figure 5B:
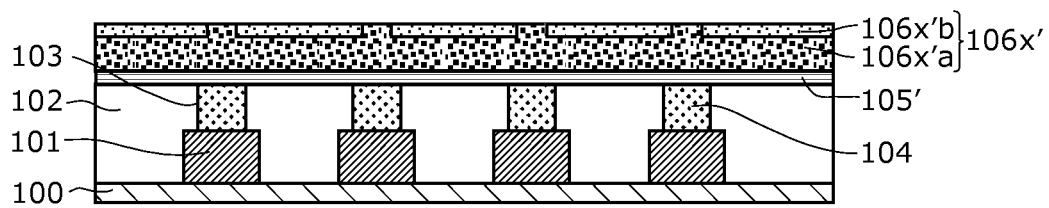
FIG. 5B is a cross sectional view illustrating a process in a third method of manufacturing the nonvolatile memory device according to Embodiment 1.
Figure 5C:
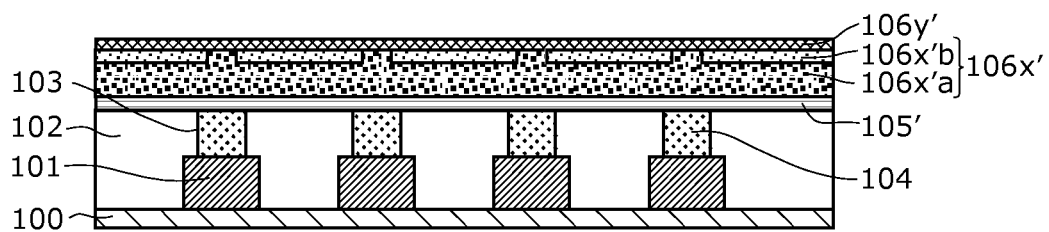
FIG. 5C is a cross sectional view illustrating a process in a third method of manufacturing the nonvolatile memory device according to Embodiment 1.

FIG. 5A through FIG. 5C are cross sectional views illustrating configurations of the main portion of the nonvolatile memory device 1A in each process in the third method of manufacturing. It should be noted that the processes before the process of forming the resist mask 108 shown in FIG. 5A are the same as those shown in FIG. 2A through FIG. 2D, and as such, descriptions thereof are omitted. Moreover, in FIG. 5A through FIG. 5C, the same reference numbers are used for the same structural elements as those in FIG. 2A through FIG. 2J, and as such, descriptions thereof are omitted.

In the third method of manufacturing, firstly, the processes up through the forming of the metal oxide material layer 106x''' shown in FIG. 2A through FIG. 2D are performed using the same methods as in the first method of manufacturing.

Next, as FIG. 5A and FIG. 3A show, the resist mask 108 is formed above the metal oxide material layer 106x''' using photolithography. Here, the shape, measurement, and positioning of the resist mask 108 is the same as that in first method of manufacturing. More specifically, as FIG. 3A shows, the planar surface shape of the resist mask 108 is a smaller rectangular shape than the shape (rectangular) of the variable resistance element 10 in a cross section parallel to the main surface of the substrate 100, and is positioned so it does not have a point of tangency with the outer perimeter of the variable resistance layer 106.

Next, as FIG. 5B and FIG. 5C show, in one device, the removal of the resist mask 108 and the formation of the second metal oxide region 106x'b are performed concurrently and, furthermore, the formation of the second variable resistance film 106y' is performed immediately thereafter.

FIG. 5B shows this process midway. Next, as FIG. 5B shows, using a dry etching device, by performing oxidation with plasma generated in gas containing oxygen, a second metal oxide region 106x'b is formed in the region of the metal oxide material layer 106x''' not covered by the resist mask 108 at the same time as the resist mask 108 is removed whereby the first metal oxide region 106x'a is exposed to the surface. At this time, when the variable resistance element 10 is viewed from above, the variable resistance element 10 is as FIG. 3C shows. The second metal oxide region 106x'b is formed to have an oxygen content atomic percentage of 65 to 75 atm %, a resistivity of $10^7$ Ω-cm or greater, and a film thickness of 3 to 10 nm.

Next, as FIG. 5C shows, in the dry etching device used to perform the removal of the resist mask 108 and the formation of the second metal oxide region 106x'b concurrently, the second variable resistance film 106y' is formed above the first variable resistance film 106x' by performing an oxidation process immediately thereafter. At this time, as FIG. 5B shows, the process of forming the second variable resistance film 106y' starts while the first metal oxide region 106x'a is exposed to the surface, and as such, the second variable resistance film 106y' is formed by oxidizing the surface layer portion of the first metal oxide region 106x'a.

It should be noted that since the second variable resistance film 106y' is formed by oxidizing the surface layer portion of the metal oxide material layer 106x''', the third metal of the third metal oxide ($TaO_z$) included in the second variable resistance film 106y' and the first metal of the first metal oxide ($TaO_x$) included in the metal oxide material layer 106x''' are the same. In Embodiment 1, the first metal, the second metal, and the third metal are each tantalum (Ta). Moreover, in the third method of manufacturing, the oxygen content atomic percentage of the second variable resistance film 106y' may be set to be the same as that of the second metal oxide ($TaO_y$). In other words, the second variable resistance film 106y' is formed to have an oxygen content atomic percentage of 65 to 75 atm %, a resistivity of $10^7$ Ω-cm or greater, and a film thickness of 3 to 10 nm. The second variable resistance film 106y' has a greater oxygen concentration and greater resistance value than the first metal oxide region 106x'a of the first variable resistance film 106x'.

It should be noted that in the third method of manufacturing, the consecutively performed processes of forming the second metal oxide region 106x'b, removing the resist mask 108, and forming the second variable resistance film 106y' are performed using a dry etching device, but an ashing device may be used, or a plasma oxidation device may be used.

As a result, (i) the first variable resistance film 106x' including the second metal oxide region 106x'b and a first metal oxide region 106x'a, which is the region other than the second metal oxide region 106x'b, and (ii) the second variable resistance film 106y' are consecutively formed. As FIG. 3B shows, when viewed from above the main surface, in the first variable resistance film 106x', the rectangular first metal oxide region 106x'a comprising the first metal oxide is formed in the central region, and the second metal oxide region 106x'b is formed surrounding the first metal oxide region 106x'a. In other words, since the first metal oxide region 106x'a is formed inward of the etching damage region at the outer perimeter region of the variable resistance element 10 in which damage from etching may be received, the influence etching damage has thereon is reduced.

It should be noted that since the consecutively performed processes of removing the resist mask 108, forming the second metal oxide region 106x'b, and forming the second variable resistance film 106y' do not include processing which changes the thickness of the film such as etching, the main surface of the first variable resistance film 106x' is flat. With this, the film thickness of a second variable resistance film 106y' formed above the first variable resistance film 106x' can be favorably controlled.

Next, the process of forming the second conductive film 107' shown in FIG. 2I and the process of patterning the first conductive film 105', the first variable resistance film 106x', the second variable resistance film 106y', and the second conductive film 107' shown in FIG. 2J are performed. This completes the nonvolatile memory device 1A.

With the third method of manufacturing, since the removal of the resist mask 108, the formation of the second metal oxide region 106x'b and the formation of the second variable resistance film 106y' are performed consecutively with one device, there is no need to perform an independent processes solely for forming the second variable resistance film 106y'.

This makes it possible to realize a reduction in manufacturing processes and reduce manufacturing time and cost.

With the first through third methods of manufacturing according to Embodiment 1, it is possible to form the nonvolatile memory device 1A in which the surface area of the region capable of being broken down in the variable resistance layer 106 can be reduced, with a method where film thickness can be favorably controlled since a process which changes the film thickness, such as etching, is not used.

Moreover, with any of the first through third methods of manufacturing, the variable resistance element 10 is formed by patterning after formation of the second metal oxide region 106x'b. For this reason, compared to when the second metal oxide region 106x'b is formed after patterning is performed, it is possible to reduce the occurrence of dimensional irregularities between elements. More specifically, the second metal oxide region 106x'b is formed without being effected by dimensional irregularities and irregularities in tapered edges which occur upon patterning the variable resistance element 10, as well as by irregularities in side wall oxidation amount resulting therefrom.

Second Embodiment

The nonvolatile memory device and method of manufacturing the same according to Embodiment 2 will be described with reference to FIG. 6 through FIG. 10C.

The nonvolatile memory device 1B according to Embodiment 2 is different from the nonvolatile memory device 1A according to Embodiment 1 in configuration of the first variable resistance layer 106x.

Figure 6:
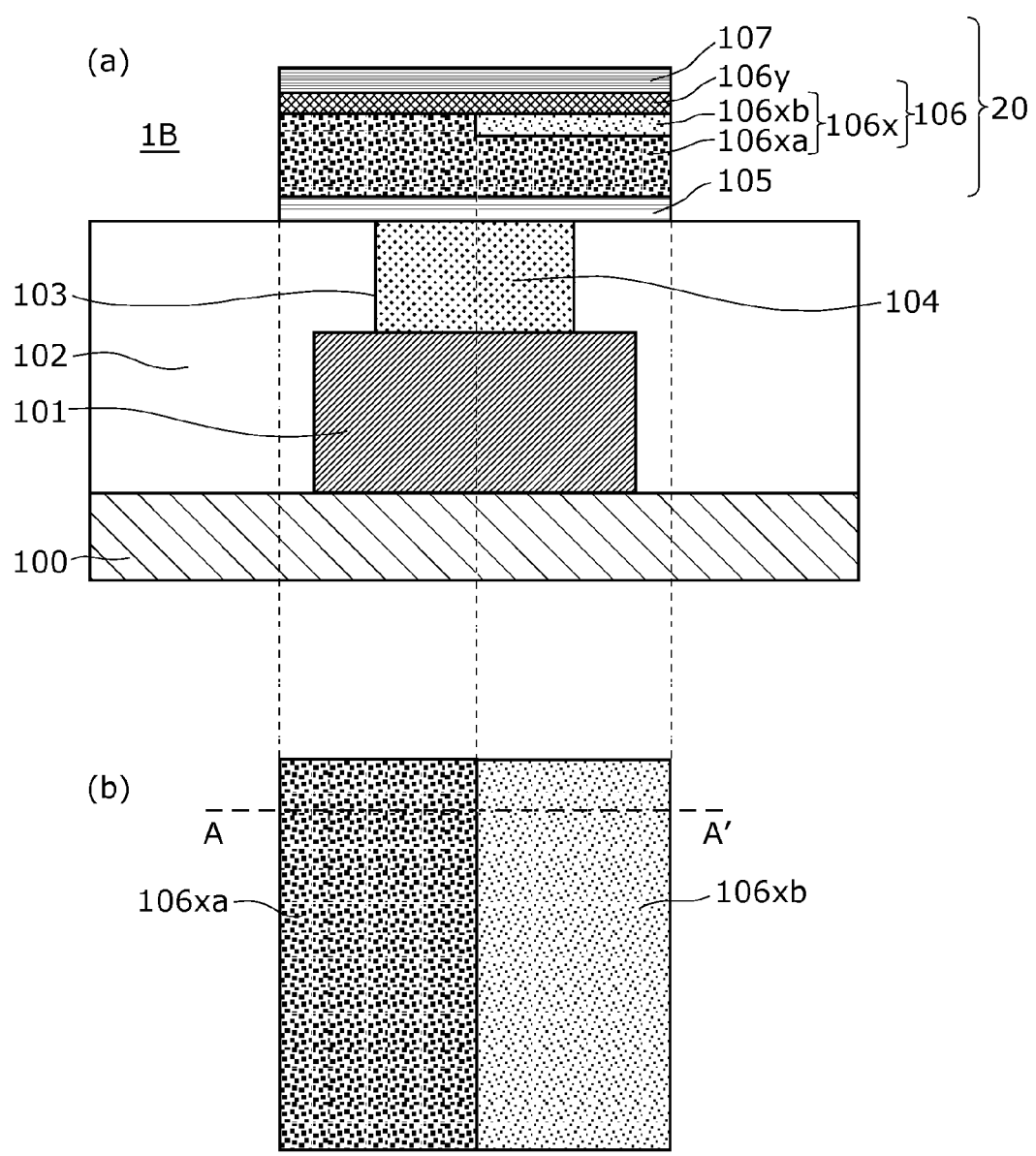
FIG. 6 shows cross sectional and planar views of an example of a configuration of the nonvolatile memory device according to Embodiment 2.

More specifically, in the nonvolatile memory device 1A according to Embodiment 1, when viewing the main surface of the first variable resistance layer 106x from above, the low oxygen concentration region 106xa is formed in the central region and the high oxygen concentration region 106xb is formed surrounding the low oxygen concentration region 106xa, but as FIG. 6 shows, in the variable resistance element 20 according to Embodiment 2, in the main surface of the first variable resistance layer 106x, the low oxygen concentration region 106xa is formed on the left half in the Drawing, and the high oxygen concentration region 106xb is formed on the right half in the Drawing. In other words, the boundary between the low oxygen concentration region 106xa and the high oxygen concentration region 106xb is a line that traverses the first variable resistance layer 106x.

[Element Structure]

First, the structure of a nonvolatile memory device 1B according to Embodiment 2 will be described with reference to FIG. 6. (a) in FIG. 6 shows a cross sectional view of an example of a configuration of the nonvolatile memory device 1B according to Embodiment 2, and corresponds with the line A-A' in (b) in FIG. 6. (b) in FIG. 6 is a planar view when viewed from above the main surface of the first variable resistance layer 106x of the nonvolatile memory device 1B shown in (a) in FIG. 6. In FIG. 6, the same reference numbers are used for the same structural elements as those in FIG. 1, and as such, descriptions thereof are omitted.

As (a) in FIG. 6 shows, the nonvolatile memory device 1B includes the substrate 100, the bottom layer line 101 formed above the substrate 100, the interlayer insulating layer 102 that covers the surface of the substrate 100 and the bottom layer line 101, the contact plug 104 formed to fill the contact hole 103 which goes through the interlayer insulating layer 102 and reaches the bottom layer line 101, and the variable resistance element 20 formed above the interlayer insulating layer 102. It should be noted that the configurations (materials and shapes) of the substrate 100, the bottom layer line 101, the interlayer insulating layer 102, the contact hole 103, and the contact plug 104 are the same as those in the nonvolatile memory device 1A according to Embodiment 1.

The variable resistance element 20 includes the first electrode 105 formed above the contact plug 104, the variable resistance layer 106 formed above the first electrode 105, and the second electrode 107 formed above the variable resistance layer 106. It should be noted that the configurations of the first electrode 105 and the second electrode 107 are the same as those in the nonvolatile memory device 1A according to Embodiment 1.

Similar to the variable resistance layer 106 according to Embodiment 1, the variable resistance layer 106 according to Embodiment 2 has a stacked structure in which the first variable resistance layer 106x and the second variable resistance layer 106y are stacked.

The first variable resistance layer 106x includes the low oxygen concentration region 106xa comprising the first metal oxide and the high oxygen concentration region 106xb comprising the second metal oxide, which has a lower degree of oxygen deficiency than the first metal oxide. The first variable resistance layer 106x has a film thickness of 20 to 100 nm. Moreover, the main surface of the first variable resistance layer 106x is flat.

The high oxygen concentration region 106xb includes a portion of the region having contact with the second variable resistance layer 106y, and is formed to not have contact with the first electrode 105. More specifically, as (b) in FIG. 6 shows, the high oxygen concentration region 106xb according to Embodiment 2 has main surface that is formed in a line shape (rectangular shape) occupying the right half shown in the Drawing, and has a film thickness (height of the tube) is from 2 to 10 nm.

The low oxygen concentration region 106xa is formed in a region of the variable resistance layer 106 other than the high oxygen concentration region 106xb. More specifically, as (b) in FIG. 6 shows, the low oxygen concentration region 106xa according to Embodiment 2 has main surface that is formed in a line shape (rectangular shape) occupying the left half shown in the Drawing.

It should be noted that in FIG. 6, an example is shown in which, in the main surface of the first variable resistance layer 106x, the low oxygen concentration region 106xa is formed on the left half in the Drawing, and the high oxygen concentration region 106xb is formed on the right half in the Drawing, but the left-right relationship may be reversed, or the low oxygen concentration region 106xa and the high oxygen concentration region 106xb may be positioned in a top-bottom arrangement.

Similar to Embodiment 1, in Embodiment 2, the first metal oxide included in the low oxygen concentration region 106xa is exemplified as being an oxygen-deficient tantalum oxide ($TaO_x$) where $0<x<2.5$). Moreover, similar to Embodiment 1, the second metal oxide included in the high oxygen concentration region 106xb is exemplified as being a tantalum oxide having a smaller degree of oxygen deficiency than the first metal oxide ($TaO_y$ where $x<y$).

Similar to Embodiment 1, the second variable resistance layer 106y has a film thickness of 2 to 10 nm, and comprises a third metal oxide which has a smaller degree of oxygen deficiency than the first metal oxide. Similar to Embodiment 1, the third metal oxide is exemplified as being a tantalum oxide having a smaller degree of oxygen deficiency than the first metal oxide ($TaO_z$ where $x<z$).

As described above, similar to the nonvolatile memory device 1A according to Embodiment 1, the nonvolatile memory device 1B according to Embodiment 2 has a configuration in which the region capable of being broken down in the second variable resistance layer 106y is narrowed due to the high oxygen concentration region 106xb formed in the first variable resistance layer 106x. As such, the current density flowing through the region capable of being broken down is higher than the current density flowing through the region capable of being broken down in a conventional variable resistance element. This makes it possible for a reduced initial breakdown voltage to be used, based on the narrowed region.

Furthermore, in the nonvolatile memory device 1B according to Embodiment 2, since the second high oxygen concentration region 106xb in the first variable resistance layer 106x does not have a surface in contact with the first electrode 105, it is possible to secure a larger low oxygen concentration region 106xa in the first variable resistance layer 106x, which functions as an oxygen reservoir below the conductive path. As a result, the current characteristics in the low resistance state stabilize, and the resistance characteristics in the high and low resistance states stabilize. As such, a stable memory characteristic can be achieved since irregularities in variable resistance characteristics between bits are reduced (since malfunctions are reduced).

Moreover, in Embodiment 2, by forming the low oxygen concentration region 106xa on the left half in the Drawing and the high oxygen concentration region 106xb on the right half in the Drawing in the main surface of the first variable resistance layer 106x, when, for example, as FIG. 8C shows, a memory cell array in which a plurality of the variable resistance elements 20 are arranged in an array in rows and columns is formed, it is possible to form the resist mask 108 to extend over and be shared by a plurality of neighboring variable resistance elements 20, which is advantageous from a miniaturization stand point. Furthermore, since a low cost mask can be used, it is possible to reduce manufacturing costs.

[First Method of Manufacturing]

An example of the first method of manufacturing the nonvolatile memory device 1B according to Embodiment 2 will be described with reference to FIG. 7A through FIG. 7F and FIG. 8A through FIG. 8C. It should be noted that hereinafter, the nonvolatile memory device 1B will be described in the case that it is equipped with a plurality of the variable resistance elements 20 shown in FIG. 6.

It should be noted that the first method of manufacturing according to Embodiment 2 corresponds with the first method of manufacturing according to Embodiment 1, but is different from the first method of manufacturing according to Embodiment 1 in that the resist mask 108 is not individually formed for each variable resistance element 20, but rather a common resist mask 108 is formed to be shared by a plurality of the variable resistance elements 20 when a memory cell array in which a plurality of the variable resistance elements 20 are arranged in an array in rows and columns is to be manufactured.

As described above, in Embodiment 2, the case where a memory cell array in which a plurality of the variable resistance elements 20 are arranged in an array in rows and columns is manufactured is exemplified. It should be noted that in FIG. 8A through FIG. 8C, for illustrative purposes, a two-by-four arrangement of the variable resistance elements 20 is exemplified.

Figure 7A:
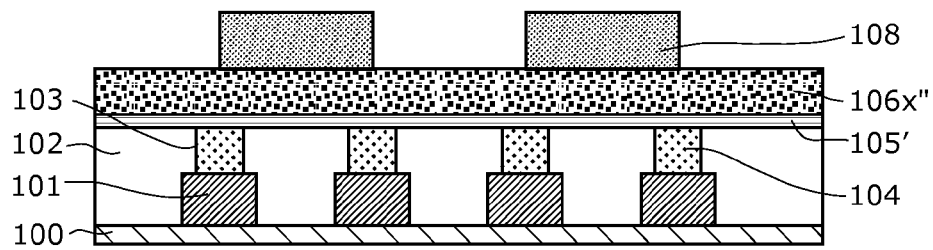
FIG. 7A is a cross sectional view illustrating a process in a first method of manufacturing the nonvolatile memory device according to Embodiment 2.

FIG. 7A through FIG. 7F are cross sectional views illustrating configurations of the main portion of the nonvolatile memory device 1B in each process in the first method of manufacturing according to Embodiment 2. Moreover, FIG. 8A through FIG. 8C are planar views from above, and correspond to FIG. 7A through FIG. 7C. The portions enclosed by the dashed lines in FIG. 8A through FIG. 8C indicate the regions in which the variable resistance elements 20 are formed. It should be noted that the processes before the process of forming the resist mask 108 shown in FIG. 7A are the same as those shown in FIG. 2A through FIG. 2D, and as such, descriptions thereof are omitted.

In the first method of manufacturing according to Embodiment 2, firstly, the processes up through the forming of the metal oxide material layer 106x'' shown in FIG. 2A through FIG. 2D are performed using the same methods as in the first method of manufacturing according to Embodiment 1.

Next, as FIG. 7A and FIG. 8A show, the resist mask 108 is formed above the metal oxide material layer 106x'' using photolithography. Here, as FIG. 8A shows, the resist mask 108 is formed in a line shape and is shared by two rows of neighboring variable resistance elements 20. More specifically, as FIG. 8A shows, the resist mask 108 according to Embodiment 2 is formed in a plurality of line shapes to extend over the region corresponding to the right side of the variable resistance elements 20 to the left in the Drawing among the two rows, and extend over the region corresponding to the left side of the variable resistance elements 20 to the right in the Drawing among the two rows. It should be noted that in Embodiment 2, the resist mask 108 is formed to extend over two rows of the variable resistance elements 20, but the resist mask 108 may be formed to extend over one row of the variable resistance elements 20, or one or two columns of the variable resistance elements 20.

Figure 7B:
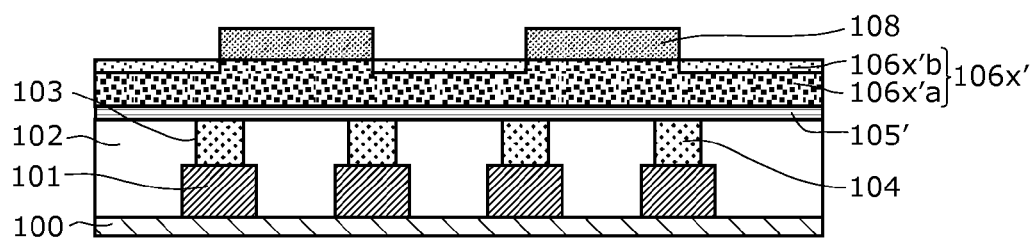
FIG. 7B is a cross sectional view illustrating a process in a first method of manufacturing the nonvolatile memory device according to Embodiment 2.

Next, as FIG. 7B and FIG. 8B show, using a dry etching device, by performing oxidation with plasma generated in gas containing oxygen, a second metal oxide region 106x'b is formed in the region of the metal oxide material layer 106x'' not covered by the resist mask 108. The second metal oxide region 106x'b is formed to have an oxygen content atomic percentage of 65 to 75 atm %, a resistivity of $10^7$ Ω-cm or greater, and a film thickness of 3 to 10 nm. At this time, the resist mask 108 is thinned. In the first method of manufacturing according to Embodiment 2, a dry etching device is used, but an ashing device or a plasma oxidation device may be used.

Figure 7C:
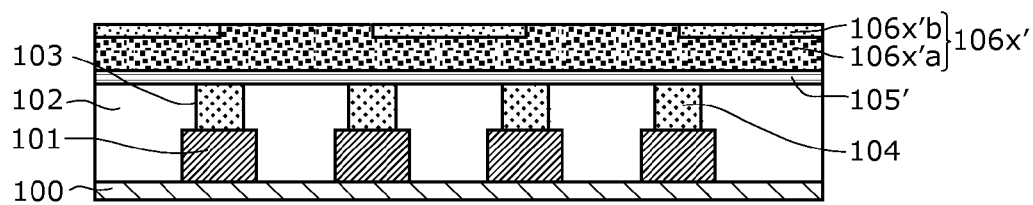
FIG. 7C is a cross sectional view illustrating a process in a first method of manufacturing the nonvolatile memory device according to Embodiment 2.

Next, as FIG. 7C and FIG. 8C show, the thinned resist mask 108 above the metal oxide material layer 106x'' is removed, and the first metal oxide region 106x'a is exposed to the surface. It should be noted that, similar to the first method of manufacturing according to Embodiment 1, it is preferable that the removal of the resist mask 108 is performed under the condition that the first metal oxide region 106x'a is difficult to be oxidized. Here, similar to Embodiment 1, the removal of the resist mask 108 is exemplified by wet etching using an ammonia hydrogen peroxide aqueous solution. It should be noted that when the resist mask 108 is removed by wet etching, an extremely thin natural oxide film is formed on the surface of the first metal oxide region 106x'a, but since the film thickness of this natural oxide film does not exceed the film thickness of the second variable resistance layer 106y, this does not effect the narrowing of the surface area of the region capable of being broken down.

As a result, a first variable resistance film 106x' including the second metal oxide region 106x'b and a first metal oxide region 106x'a, which is the region other than the second metal oxide region 106x'b, is formed. It should be noted that in the first method of manufacturing according to Embodiment 2, similar to the first method of manufacturing in Embodiment 1, since the processes of forming the second metal oxide region 106x'b does not include processing which changes the thickness of the film such as etching, the main surface of the first variable resistance film 106x' is flat.

Figure 7D:
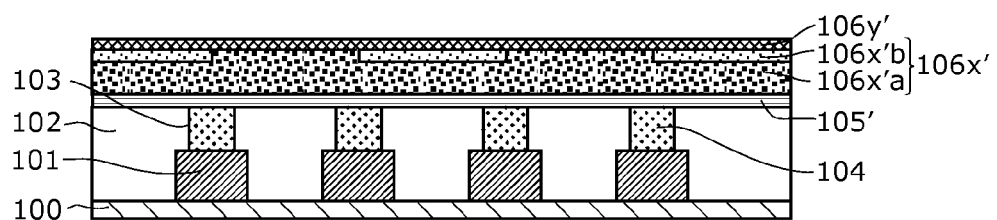
FIG. 7D is a cross sectional view illustrating a process in a first method of manufacturing the nonvolatile memory device according to Embodiment 2.

Next, as FIG. 7D shows, the second variable resistance film 106y' comprising the third metal oxide is formed (deposited) above the first variable resistance film 106x'. Here, similar to the first method of manufacturing according to Embodiment 1, the second variable resistance film 106y' is formed by the so-called reactive sputtering method of sputtering a tantalum target in a gas atmosphere of argon (Ar) and oxygen. Similar to the first method of manufacturing according to Embodiment 1, the second variable resistance film 106y' is formed to have an oxygen content atomic percentage of 65 to 75 atm %, a resistivity of $10^7$ Ω-cm or greater, and a film thickness of 3 to 10 nm. In other words, the second variable resistance film 106y' has a greater oxygen concentration and greater resistance value than the first metal oxide region 106x'a of the first variable resistance film 106x'.

Figure 7E:
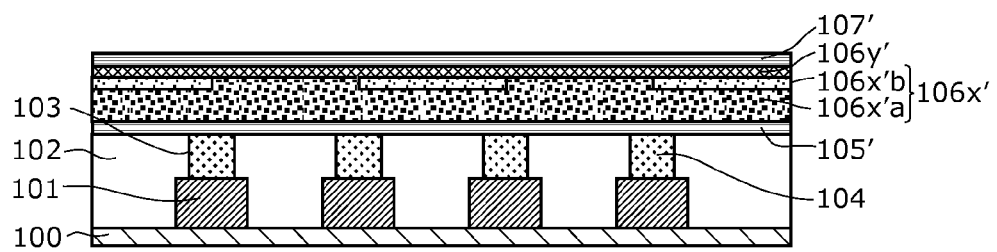
FIG. 7E is a cross sectional view illustrating a process in a first method of manufacturing the nonvolatile memory device according to Embodiment 2.

Next, as FIG. 7E shows, a second conductive film 107' comprising a noble metal (platinum (Pt), iridium (Ir), palladium (Pd), etc.), which is the second electrode material of the second electrode 107, is formed (deposited) above the second variable resistance film 106y'.

Figure 7F:
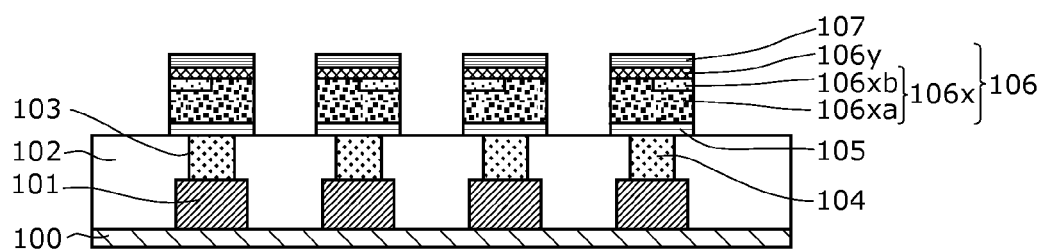
FIG. 7F is a cross sectional view illustrating a process in a first method of manufacturing the nonvolatile memory device according to Embodiment 2.

Next, as FIG. 7F shows, the first conductive film 105', the first variable resistance film 106x', the second variable resistance film 106y' and the second conductive film 107' shown in FIG. 7E are patterned using a desired mask. As a result, the variable resistance element 20 is formed in which the variable resistance layer 106 configured of the stacked first variable resistance layer 106x and second variable resistance layer 106y is formed between the first electrode 105 and the second electrode 107. It should be noted that similar to Embodiment 1, when a noble metal is used as the second electrode material in the second electrode 107, the variable resistance element 20 can be formed by making this into a hard mask. Moreover, similar to Embodiment 1, patterning is not required to be performed in one batch, but may be performed individually for each layer.

Similar to the first method of manufacturing according to Embodiment 1, by subsequently performing processes such as the process of covering the variable resistance element 20 with an interlayer insulating film, the process of forming a contact plug connected to the second electrode 107 of the variable resistance element 20, and the process of forming a top layer line connected to the contact plug (not shown in the Drawings), the nonvolatile memory device 1B including the variable resistance element 20 according to Embodiment 2 can be formed.

With the first method of manufacturing according to Embodiment 2, it is possible to use a line shaped resist mask 108 which is shared by a plurality of neighboring variable resistance elements 20 in the process of forming the resist mask 108, which is advantageous from a miniaturization standpoint. Furthermore, since a low cost mask can be used, it is possible to reduce manufacturing costs.

[Second Method of Manufacturing]

An example of the second method of manufacturing the nonvolatile memory device 1B according to Embodiment 2 will be described with reference to FIG. 9A through FIG. 9C, as well as FIG. 8A and FIG. 8C. It should be noted that hereinafter, the nonvolatile memory device 1B will be described in the case that it is equipped with a plurality of the variable resistance elements 20 shown in FIG. 6.

The second method of manufacturing according to Embodiment 2 is different from the first method of manufacturing according to Embodiment 2 in that the process of forming the second metal oxide region 106x'b shown in FIG. 7B and the process of removing the resist mask 108 shown in FIG. 7C are performed concurrently.

It should be noted that the second method of manufacturing according to Embodiment 2 corresponds with the second method of manufacturing according to Embodiment 1, but is different from the second method of manufacturing according to Embodiment 1 in that a common resist mask 108 is formed to be shared by a plurality of the variable resistance elements 20 when a memory cell array in which a plurality of the variable resistance elements 20 are arranged in an array in rows and columns is to be manufactured.

Figure 9A:
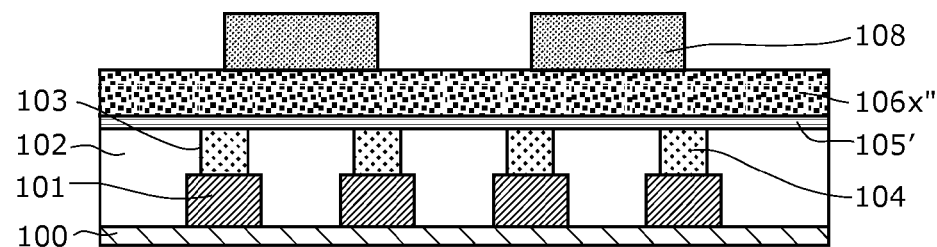
FIG. 9A is a cross sectional view illustrating a process in a second method of manufacturing the nonvolatile memory device according to Embodiment 2.
Figure 9B:
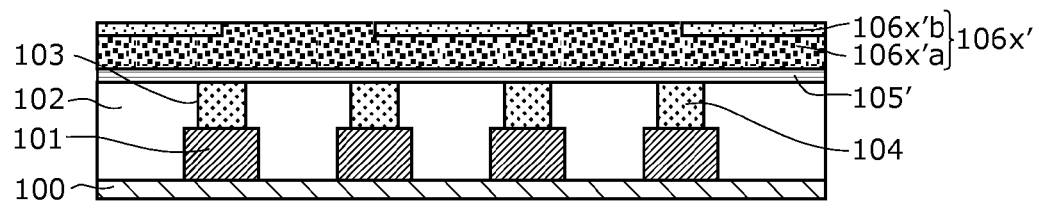
FIG. 9B is a cross sectional view illustrating a process in a second method of manufacturing the nonvolatile memory device according to Embodiment 2.
Figure 9C:
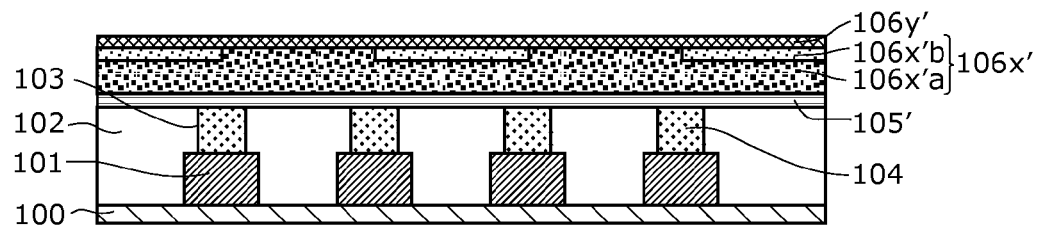
FIG. 9C is a cross sectional view illustrating a process in a second method of manufacturing the nonvolatile memory device according to Embodiment 2.

FIG. 9A through FIG. 9C are cross sectional views illustrating configurations of the main portion of the nonvolatile memory device 1B in each process in the second method of manufacturing according to Embodiment 2. It should be noted that the processes before the process of forming the resist mask 108 shown in FIG. 9A are the same as those shown in FIG. 2A through FIG. 2D, and as such, descriptions thereof are omitted. Moreover, in FIG. 9A through FIG. 9C, the same reference numbers are used for the same structural elements as those in FIG. 2A through FIG. 2D, and as such, descriptions thereof are omitted.

In the second method of manufacturing according to Embodiment 2, firstly, the processes up through the forming of the metal oxide material layer 106x'' shown in FIG. 2A through FIG. 2D are performed using the same methods as in the first method of manufacturing according to Embodiment 1.

Next, as FIG. 9A and FIG. 8A show, the resist mask 108 is formed above the metal oxide material layer 106x'' using photolithography. Here, the shape, measurement, and positioning of the resist mask 108 is the same as that in first method of manufacturing according to Embodiment 2. More specifically, as FIG. 8A shows, the resist mask 108 according to Embodiment 2 is formed in a plurality of line shapes to extend over the region corresponding to the right side of the variable resistance elements 20 to the left in the Drawing among the two rows, and extend over the region corresponding to the left side of the variable resistance elements 20 to the right in the Drawing among the two rows. It should be noted that in Embodiment 2, the resist mask 108 is formed to extend over two rows of the variable resistance elements 20, but the resist mask 108 may be formed to extend over one row of the variable resistance elements 20.

Next, as FIG. 9B shows, using a dry etching device, by performing oxidation with plasma generated in gas containing oxygen, a second metal oxide region 106x'b is formed in the region of the metal oxide material layer 106x'' not covered by the resist mask 108 at the same time as the resist mask 108 is removed whereby the first metal oxide region 106x' a is exposed to the surface. At this time, when the nonvolatile memory device 1B is viewed from above, the nonvolatile memory device 1B is as FIG. 8C shows. The second metal oxide region 106x'b is formed to have an oxygen content atomic percentage of 65 to 75 atm %, a resistivity of $10^7$ Ω-cm or greater, and a film thickness of 3 to 10 nm. In the second method of manufacturing according to Embodiment 2, a dry etching device is used to perform the formation of the second metal oxide region 106x'b and the removal of the resist mask 108 concurrently, but an ashing device or a plasma oxidation device may be used.

As a result, a first variable resistance film 106x' including the second metal oxide region 106x'b and a first metal oxide region 106x'a, which is the region other than the second metal oxide region 106x'b, is formed. It should be noted that in the second method of manufacturing according to Embodiment 2, similar to the second method of manufacturing in Embodiment 1, since the processes of forming the second metal oxide region 106x'b does not include processing which changes the thickness of the film such as etching, the main surface of the first variable resistance film 106x' is flat.

Next, as FIG. 9C shows, the second variable resistance film 106y' comprising the third metal oxide is formed (deposited) above the first variable resistance film 106x'. More specifically, in the second method of manufacturing according to Embodiment 2, the second variable resistance film 106y' is formed by the so-called reactive sputtering method of sputtering a tantalum target in a gas atmosphere of argon (Ar) and oxygen. The second variable resistance film 106y' is formed to have an oxygen content atomic percentage of 65 to 75 atm %, a resistivity of $10^7$ Ω-cm or greater, and a film thickness of 3 to 10 nm. In other words, the second variable resistance film 106y' has a greater oxygen concentration and greater resistance value than the first metal oxide region 106x'a of the first variable resistance film 106x'.

Next, similar to the first method of manufacturing according to Embodiment 1, the process of forming the second conductive film 107' shown in FIG. 2J and the process of patterning the first conductive film 105', the first variable resistance film 106x', the second variable resistance film 106y', and the second conductive film 107' shown in FIG. 2J are performed. This completes the nonvolatile memory device 1B.

Similar to the first method of manufacturing according to Embodiment 2, with the second method of manufacturing according to Embodiment 2, the resist mask 108 for forming the first metal oxide region 106x'a and the second metal oxide region 106x'b in the first variable resistance film 106x is formed extending over a plurality of neighboring variable resistance elements 20, which is advantageous from a miniaturization standpoint. Furthermore, since a low cost mask can be used, it is possible to reduce manufacturing costs.

Moreover, similar to the second method of manufacturing according to Embodiment 1, in the second method of manufacturing according to Embodiment 2, since the removal of the resist mask 108 and the formation of the second metal oxide region 106x'b are performed concurrently, there is no need to perform an independent processes solely for removing the resist mask 108. As such, the number manufacturing processes performed can be reduced, making it possible to reduce manufacturing costs.

[Third Method of Manufacturing]

An example of the third method of manufacturing the nonvolatile memory device 1B according to Embodiment 2 will be described with reference to FIG. 10A through FIG. 10C, as well as FIG. 8A and FIG. 8C. It should be noted that hereinafter, the nonvolatile memory device 1B will be described in the case that it is equipped with a plurality of the variable resistance elements 20 shown in FIG. 6.

The third method of manufacturing according to Embodiment 2 is different from the second method of manufacturing according to Embodiment 2 in that (i) the formation of the second metal oxide region 106x'b and the removal of the resist mask 108 (FIG. 9B) and (ii) the formation of the second variable resistance film 106y' (FIG. 9C) are performed consecutively within the same device.

It should be noted that the third method of manufacturing according to Embodiment 2 corresponds with the third method of manufacturing according to Embodiment 1, but is different from the third method of manufacturing according to Embodiment 1 in that a common resist mask 108 is formed to be shared by a plurality of the variable resistance elements 20 when a memory cell array in which a plurality of the variable resistance elements 20 are arranged in an array in rows and columns is to be manufactured.

Figure 10A:
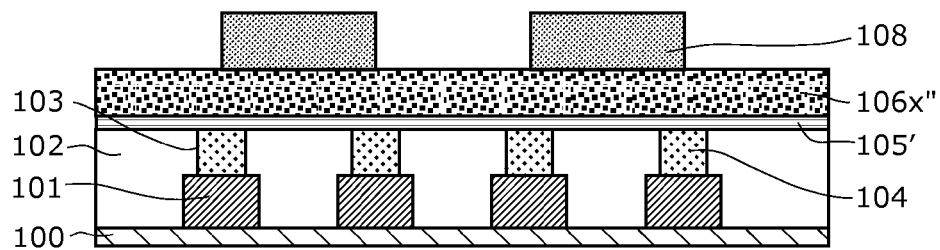
FIG. 10A is a cross sectional view illustrating a process in a third method of manufacturing the nonvolatile memory device according to Embodiment 2.
Figure 10B:
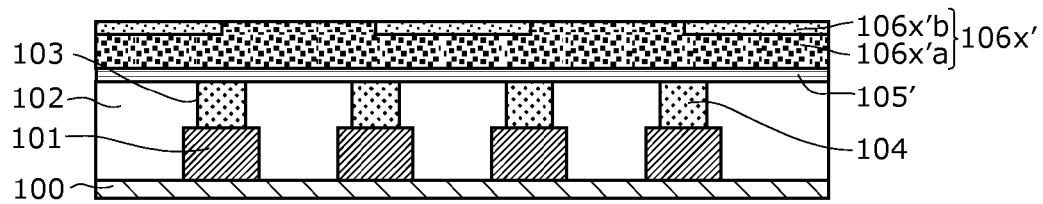
FIG. 10B is a cross sectional view illustrating a process in a third method of manufacturing the nonvolatile memory device according to Embodiment 2.
Figure 10C:
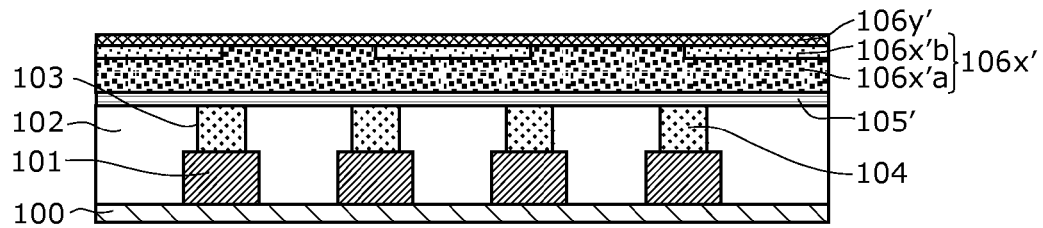
FIG. 10C is a cross sectional view illustrating a process in a third method of manufacturing the nonvolatile memory device according to Embodiment 2.

FIG. 10A through FIG. 10C are cross sectional views illustrating configurations of the main portion of the nonvolatile memory device 1B in each process in the third method of manufacturing according to Embodiment 2. It should be noted that the processes before the process of forming the resist mask 108 shown in FIG. 10A are the same as those shown in FIG. 2A through FIG. 2D, and as such, descriptions thereof are omitted. In FIG. 10A through FIG. 10C, the same reference numbers are used for the same structural elements as those in FIG. 2A through FIG. 2J, and as such, descriptions thereof are omitted.

In the third method of manufacturing according to Embodiment 2, firstly, the processes up through the forming of the metal oxide material layer 106x''' shown in FIG. 2A through FIG. 2D are performed using the same methods as in the first method of manufacturing according to Embodiment 1.

Next, as FIG. 10A and FIG. 8A show, the resist mask 108 is formed above the metal oxide material layer 106x''' using photolithography. Here, the shape, measurement, and positioning of the resist mask 108 is the same as that in first method of manufacturing according to Embodiment 2. More specifically, as FIG. 8A shows, the resist mask 108 according to Embodiment 2 is formed in a plurality of line shapes to extend over the region corresponding to the right side of the variable resistance elements 20 to the left in the Drawing among the two rows, and extend over the region corresponding to the left side of the variable resistance elements 20 to the right in the Drawing among the two rows. It should be noted that in Embodiment 2, the resist mask 108 is formed to extend over two rows of the variable resistance elements 20, but the resist mask 108 may be formed to extend over one row of the variable resistance elements 20, or one or two columns of the variable resistance elements 20.

Next, as FIG. 10B shows, using a dry etching device, by performing oxidation with plasma generated in gas containing oxygen, a second metal oxide region 106x'b is formed in the region of the metal oxide material layer 106x''' not covered by the resist mask 108 at the same time as the resist mask 108 is removed whereby the first metal oxide region 106x'a is exposed to the surface. At this time, when the nonvolatile memory device 1B is viewed from above, the nonvolatile memory device 1B is as FIG. 8C shows. The second metal oxide region 106x'b is formed to have an oxygen content atomic percentage of 65 to 75 atm %, a resistivity of $10^7$ Ω-cm or greater, and a film thickness of 3 to 10 nm.

Next, as FIG. 10C shows, in the dry etching device used to perform the removal of the resist mask 108 and the formation of the second metal oxide region 106x'b concurrently, the second variable resistance film 106y' is formed above the first variable resistance film 106x' by performing an oxidation process immediately thereafter. At this time, as FIG. 10B shows, the process of forming the second variable resistance film 106y' starts while the first metal oxide region 106x'a is exposed to the surface, and as such, the second variable resistance film 106y' is formed by oxidizing the surface layer portion of the first metal oxide region 106x'a.

It should be noted that since the second variable resistance film 106y' is formed by oxidizing the surface layer portion of the metal oxide material layer 106x''', the third metal of the third metal oxide (TaO$_z$) included in the second variable resistance film 106y' and the first metal of the first metal oxide (TaO$_x$) included in the metal oxide material layer 106x''' are the same. In Embodiment 2, similar to Embodiment 1, the first metal, the second metal, and the third metal are each tantalum (Ta). Moreover, in the third method of manufacturing according to Embodiment 2, the oxygen content atomic percentage of the second variable resistance film $106y'$ may be set to be the same as that of the second metal oxide ($TaO_y$). In other words, the second variable resistance film $106y'$ is formed to have an oxygen content atomic percentage of 65 to 75 atm %, a resistivity of $10^7$ Ω-cm or greater, and a film thickness of 3 to 10 nm. The second variable resistance film $106y'$ has a greater oxygen concentration and greater resistance value than the first metal oxide region $106x'a$ of the first variable resistance film $106x'$.

It should be noted that in the third method of manufacturing according to Embodiment 2, the consecutively performed processes of forming the second metal oxide region $106x'b$, removing the resist mask 108, and forming the second variable resistance film $106y'$ are performed using a dry etching device, but an ashing device may be used, or a plasma oxidation device may be used.

As a result, (i) the first variable resistance film $106x'$ including the second metal oxide region $106x'b$ and a first metal oxide region $106x'a$, which is the region other than the second metal oxide region $106x'b$, and (ii) the second variable resistance film $106y'$ are formed consecutively. It should be noted that since the consecutively performed processes of forming the second metal oxide region $106x'b$, removing the resist mask 108, and forming the second variable resistance film $106y'$ do not include processing which changes the thickness of the film such as etching, the main surface of the first variable resistance film $106x'$ is flat.

Next, the process of forming the second conductive film $107'$ shown in FIG. 2I and the process of patterning the first conductive film $105'$, the first variable resistance film $106x'$, the second variable resistance film $106y'$, and the second conductive film $107'$ shown in FIG. 2J are performed. This completes the nonvolatile memory device 1B.

Similar to the first and second methods of manufacturing according to Embodiment 2, with the third method of manufacturing according to Embodiment 2, the resist mask 108 for forming the first metal oxide region $106x'a$ and the second metal oxide region $106x'b$ in the first variable resistance film $106x$ is formed extending over a plurality of neighboring variable resistance elements 20, which is advantageous from a miniaturization standpoint. Furthermore, since a low cost mask can be used, it is possible to reduce manufacturing costs.

Moreover, similar to the third method of manufacturing according to Embodiment 1, in the third method of manufacturing according to Embodiment 2, since the removal of the resist mask 108, for forming of the second metal oxide region $106x'b$, and the forming of the second variable resistance film $106y'$ are consecutively performed in one device, there is no need for an independent process for forming the second variable resistance film $106y$. This makes it possible to realize a reduction in manufacturing processes and reduce manufacturing time and cost.

With the first through third methods of manufacturing according to Embodiment 2, it is possible to form the nonvolatile memory device 1B in which the surface area of the region capable of being broken down in the variable resistance layer 106 can be reduced, with a method where film thickness can be favorably controlled since a process which changes the film thickness, such as etching, is not used. Moreover, with any of the first through third methods of manufacturing, the variable resistance element 10 is formed by patterning after formation of the second metal oxide region $106x'b$. For this reason, compared to when the second metal oxide region $106x'b$ is formed after patterning is performed, it is possible to reduce the occurrence of dimensional irregularities between elements.

Third Embodiment

The nonvolatile memory device and method of manufacturing the same according to Embodiment 3 will be described with reference to FIG. 11 through FIG. 15C.

The nonvolatile memory device 1C according to Embodiment 3 is different from the nonvolatile memory device 1A according to Embodiment 1 and the nonvolatile memory device 1B according to Embodiment 2 in configuration of the first variable resistance layer $106x$.

Figure 11:
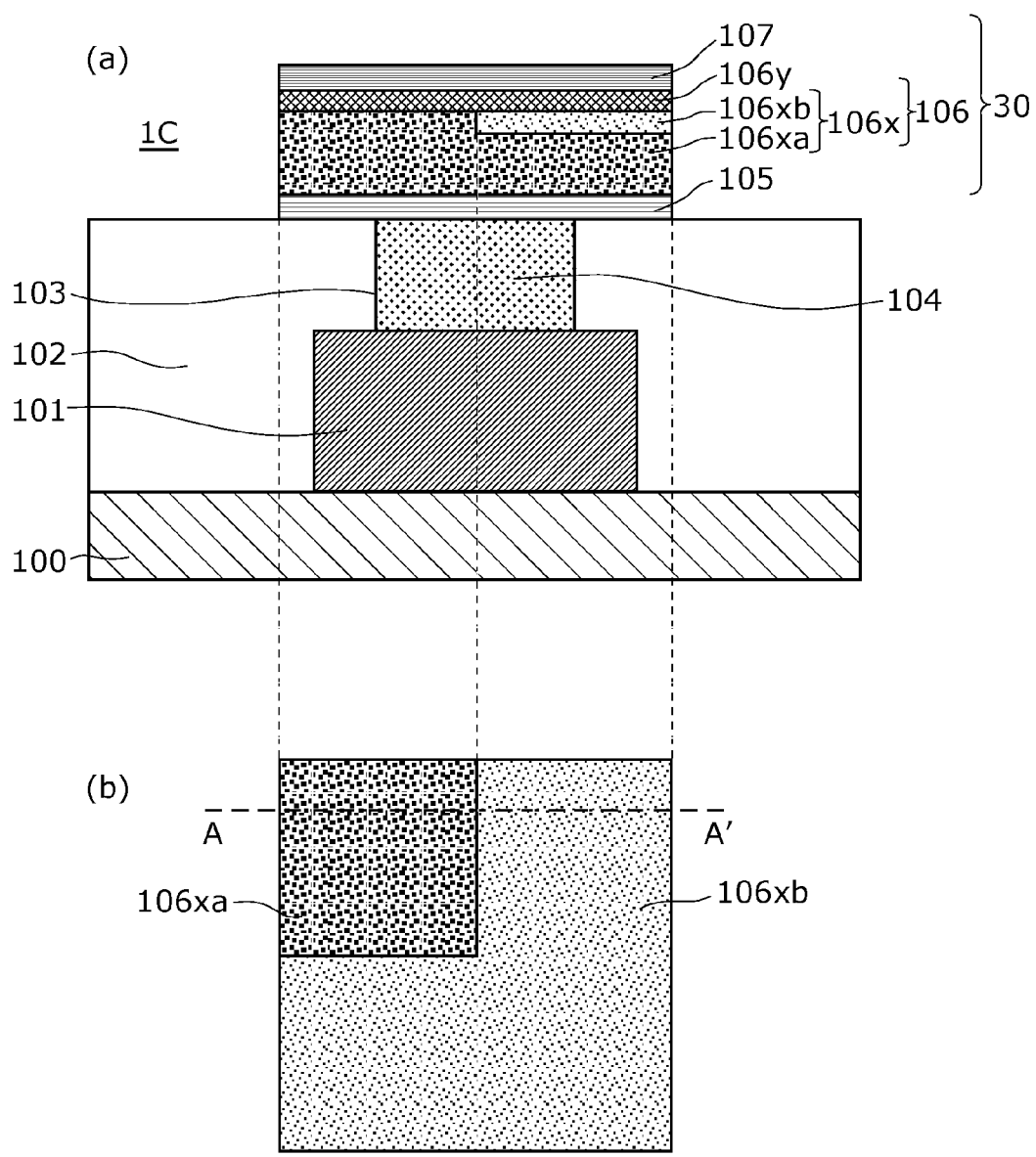
FIG. 11 shows cross sectional and planar views of an example of a configuration of the nonvolatile memory device according to Embodiment 3.

More specifically, in the nonvolatile memory device 1A according to Embodiment 1, when viewing the main surface of the first variable resistance layer $106x$ from above, the low oxygen concentration region $106xa$ is formed in the central region and the high oxygen concentration region $106xb$ is formed surrounding the low oxygen concentration region $106xa$, but as FIG. 11 shows, in the nonvolatile memory device 1C according to Embodiment 3, when a variable resistance element 30 has a rectangular shape, in the main surface of the first variable resistance layer $106x$, the low oxygen concentration region $106xa$ is formed in a rectangular shape small than that of the variable resistance element 30, and the top-left corner in the Drawing is arranged to match with the top-left corner of the variable resistance element 30 in the Drawing. In other words, the boundary between the low oxygen concentration region $106xa$ and the high oxygen concentration region $106xb$ is a line that traverses the first variable resistance layer $106x$ and has one corner.

[Element Structure]

First, the structure of a nonvolatile memory device 1C according to Embodiment 3 will be described with reference to FIG. 11. (a) in FIG. 11 shows a cross sectional view of an example of a configuration of the nonvolatile memory device 1C according to Embodiment 3, and corresponds with the line A-A' in (b) in FIG. 11. (b) in FIG. 11 is a planar view when viewed from above the main surface of the first variable resistance layer $106x$ of the nonvolatile memory device 1C shown in (a) in FIG. 11. In FIG. 11, the same reference numbers are used for the same structural elements as those in FIG. 1, and as such, descriptions thereof are omitted.

As (a) in FIG. 11 shows, the nonvolatile memory device 1C includes the substrate 100, the bottom layer line 101 formed above the substrate 100, the interlayer insulating layer 102 that covers the surface of the substrate 100 and the bottom layer line 101, the contact plug 104 formed to fill the contact hole 103 which goes through the interlayer insulating layer 102 and reaches the bottom layer line 101, and the variable resistance element 30 formed above the interlayer insulating layer 102. It should be noted that the configurations (materials and shapes) of the substrate 100, the bottom layer line 101, the interlayer insulating layer 102, the contact hole 103, and the contact plug 104 are the same as those in the nonvolatile memory device 1A according to Embodiment 1.

The variable resistance element 30 includes the first electrode 105 formed above the contact plug 104, the variable resistance layer 106 formed above the first electrode 105, and the second electrode 107 formed above the variable resistance layer 106. It should be noted that the configurations of the first electrode 105 and the second electrode 107 are the same as those in the nonvolatile memory device 1A according to Embodiment 1.

Similar to the variable resistance layer 106 according to Embodiment 1, the variable resistance layer 106 according to Embodiment 3 has a stacked structure in which the first variable resistance layer 106x and the second variable resistance layer 106y are stacked.

The first variable resistance layer 106x includes the low oxygen concentration region 106xa comprising the first metal oxide and the high oxygen concentration region 106xb comprising the second metal oxide, which has a lower degree of oxygen deficiency than the first metal oxide. The first variable resistance layer 106x has a film thickness of 20 to 100 nm. Moreover, the main surface of the first variable resistance layer 106x is rectangular and flat.

The shape of the low oxygen concentration region 106xa on the main surface of the first variable resistance layer 106x is rectangular and smaller than the main surface of the first variable resistance layer 106x, and one corner is arranged to match one corner of the first variable resistance layer 106x. More specifically, in FIG. 11, in Embodiment 3, the longitudinal and lateral lengths are approximately half that of the main surface of the first variable resistance layer 106x. Furthermore, the low oxygen concentration region 106xa is arranged so that the top-left corner in the Drawing thereof matches with the top-left corner in the Drawing of the first variable resistance layer 106x. It should be noted that the size (longitudinal and lateral lengths) of the low oxygen concentration region 106xa is preferably set based on the manufacturing processes used and the degree of narrowing of the region capable of being broken down.

The shape of the high oxygen concentration region 106xb on the main surface of the first variable resistance layer 106x is the shape of the main surface of the first variable resistance layer 106x minus the low oxygen concentration region 106xa, and is formed in an L shape (In FIG. 11, the L shape is rotated counter-clockwise 90 degrees).

With this kind of configuration, in the main surface of the first variable resistance layer 106x, a corner (bend) made in the boundary of the high oxygen concentration region 106xb and the low oxygen concentration region 106xa is formed. It should be noted that upon manufacturing the corner, it is not possible to make a perfectly right angle corner, and it is acceptable if the corner is formed having a curvature with a high rate in variation.

It should be noted that in FIG. 11, for illustrative purposes, the low oxygen concentration region 106xa is formed in the top-left hand of the main surface of the first variable resistance layer 106x in the drawings, but it may be formed in the bottom-left, top-right, or bottom-right hand of the main surface of the first variable resistance layer 106x in the drawings. In other words, the orientation of the corner is not limited to the bottom-right direction shown in FIG. 11, but may be oriented in the top-right, bottom-left, or top-left direction in the drawings.

Moreover, similar to Embodiment 1, in Embodiment 3, the first metal oxide included in the low oxygen concentration region 106xa is exemplified as being an oxygen-deficient tantalum oxide (TaO$_x$ where 0<x<2.5). Moreover, similar to Embodiment 1, the second metal oxide included in the high oxygen concentration region 106xb is exemplified as being a tantalum oxide having a smaller degree of oxygen deficiency than the first metal oxide (TaO$_y$ where x<y).

Similar to Embodiment 1, the second variable resistance layer 106y has a film thickness of 2 to 10 nm, and comprises a third metal oxide which has a smaller degree of oxygen deficiency than the first metal oxide. Similar to Embodiment 1, the third metal oxide is exemplified as being a tantalum oxide having a smaller degree of oxygen deficiency than the first metal oxide (TaO$_z$ where x<z).

As described above, similar to the nonvolatile memory device 1A according to Embodiment 1, the nonvolatile memory device 1C according to Embodiment 3 has a configuration in which the region capable of being broken down in the second variable resistance layer 106y is narrowed due to the high oxygen concentration region 106xb formed in the first variable resistance layer 106x. As such, the current density flowing through the region capable of being broken down is higher than the current density flowing through the region capable of being broken down in a conventional variable resistance element. This makes it possible for a reduced initial breakdown voltage to be used, based on the narrowed region.

Moreover, in Embodiment 3, for example, when a memory cell array in which a plurality of the variable resistance elements 30 are arranged in an array in rows and columns is to be manufactured, as FIG. 13C shows, the resist mask 108 is formed to extend over four neighboring variable resistance elements 30 in a two-by-two arrangement, which is advantageous from a miniaturization standpoint. Furthermore, since a low cost mask can be used, it is possible to reduce manufacturing costs.

Moreover, with the nonvolatile memory device 1C according to Embodiment 3, since the surface area of the region capable of being broken down is small, it is possible to further narrow the surface area of the region capable of being broken down and further reduce irregularities in initial breakdown voltage.

Furthermore, in the nonvolatile memory device 1C according to Embodiment 3, since the second high oxygen concentration region 106xb in the first variable resistance layer 106x does not have a surface in contact with the first electrode 105, it is possible to secure a larger low oxygen concentration region 106xa in the first variable resistance layer 106x, which functions as an oxygen reservoir below the conductive path. As a result, the current characteristics in the low resistance state stabilize, and the resistance characteristics in the high and low resistance states stabilize. As such, a stable memory characteristic can be achieved since irregularities in variable resistance characteristics between bits are reduced (since malfunctions are reduced).

[First Method of Manufacturing]

An example of the first method of manufacturing the nonvolatile memory device 1C according to Embodiment 3 will be described with reference to FIG. 12A through FIG. 12F and FIG. 13A through FIG. 13C. It should be noted that hereinafter, the nonvolatile memory device 1C will be described in the case that it is equipped with a plurality of the variable resistance elements 30 shown in FIG. 11.

It should be noted that the first method of manufacturing according to Embodiment 3 corresponds with the first method of manufacturing according to Embodiment 1, but is different from the first method of manufacturing according to Embodiment 1 in that the resist mask 108 is not individually formed for each variable resistance element 30, but rather a common resist mask 108 is formed to be shared by four of the variable resistance elements 30 arranged in a two-by-two pattern when a memory cell array in which a plurality of the variable resistance elements 30 are arranged in an array in rows and columns is to be manufactured.

As described above, in Embodiment 3, the case where a memory cell array in which a plurality of the variable resistance elements 30 are arranged in an array in rows and columns is manufactured is exemplified. It should be noted that in FIG. 13A through FIG. 13C, for illustrative purposes, a two-by-four arrangement of the variable resistance elements 30 is exemplified.

Figure 12A:
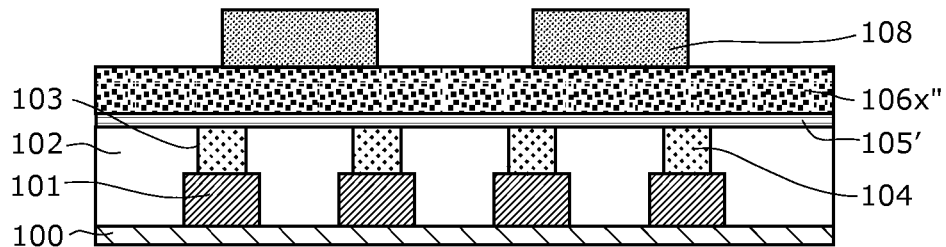
FIG. 12A is a cross sectional view illustrating a process in a first method of manufacturing the nonvolatile memory device according to Embodiment 3.

FIG. 12A through FIG. 12F are cross sectional views illustrating configurations of the main portion of the nonvolatile memory device 1C in each process in the first method of manufacturing according to Embodiment 3. Moreover, FIG. 13A through FIG. 13C are planar views from above, and correspond to FIG. 12A through FIG. 12C. The portions enclosed by the dashed lines in FIG. 13A through FIG. 13C indicate the regions in which the variable resistance elements 30 are formed. It should be noted that the processes before the process of forming the resist mask 108 shown in FIG. 12A are the same as those shown in FIG. 2A through FIG. 2D, and as such, descriptions thereof are omitted.

In the first method of manufacturing according to Embodiment 3, firstly, the processes up through the forming of the metal oxide material layer 106x'' shown in FIG. 2A through FIG. 2D are performed using the same methods as in the first method of manufacturing according to Embodiment 1.

Next, as FIG. 12A and FIG. 13A show, the resist mask 108 is formed above the metal oxide material layer 106x'' using photolithography. Here, as FIG. 13A shows, the shape of the resist mask 108 having contact with the main surface is rectangular and is arranged to extend over regions in which four neighboring variable resistance elements 30 are formed in a two-by-two pattern and arranged so that each corner of the resist mask 108 is included in one of the formation regions of the four variable resistance elements 30. In other words, among the regions in which four neighboring variable resistance elements 30 in a two-by-two pattern are formed in FIG. 13A, the resist mask 108 is formed to cover the bottom-right portion of the top-left variable resistance element 30 in the drawing, the top-right portion of the bottom-left variable resistance element 30 in the drawing, the bottom-left portion of the top-right variable resistance element 30 in the drawing, and the top-left portion of the bottom-right variable resistance element 30 in the drawing. It should be noted that in Embodiment 3, the resist mask 108 is formed to extend over the regions in which four neighboring variable resistance elements 30 are formed, but the resist mask 108 may be formed to extend over two neighboring variable resistance elements 30. Moreover, the surface area (longitudinal and lateral lengths) of the overlapping areas of the resist mask 108 and the regions in which the variable resistance elements 30 are formed is preferably set based on the manufacturing processes used and the degree of narrowing of the region capable of being broken down. In Embodiment 3, the resist mask 108 is formed to cover approximately a quarter of the surface area of the main surface of the first variable resistance layer 106x.

Figure 12B:
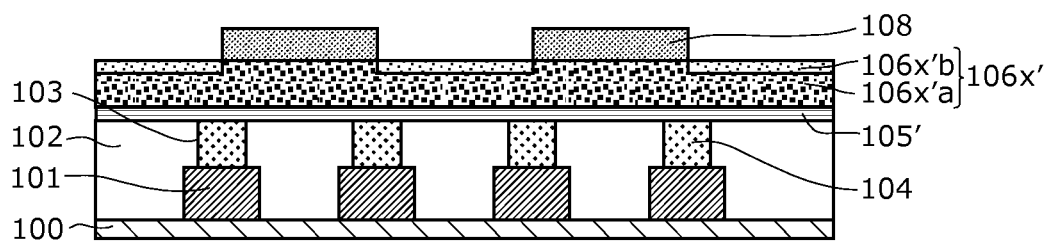
FIG. 12B is a cross sectional view illustrating a process in a first method of manufacturing the nonvolatile memory device according to Embodiment 3.

Next, as FIG. 12B and FIG. 13B show, using a dry etching device, by performing oxidation with plasma generated in gas containing oxygen, a second metal oxide region 106x'b is formed in the region of the metal oxide material layer 106x'' not covered by the resist mask 108. The second metal oxide region 106x'b is formed to have an oxygen content atomic percentage of 65 to 75 atm %, a resistivity of $10^7$ Ω-cm or greater, and a film thickness of 3 to 10 nm. At this time, the resist mask 108 is thinned. In the first method of manufacturing according to Embodiment 2, a dry etching device is used, but an ashing device or a plasma oxidation device may be used.

Figure 12C:
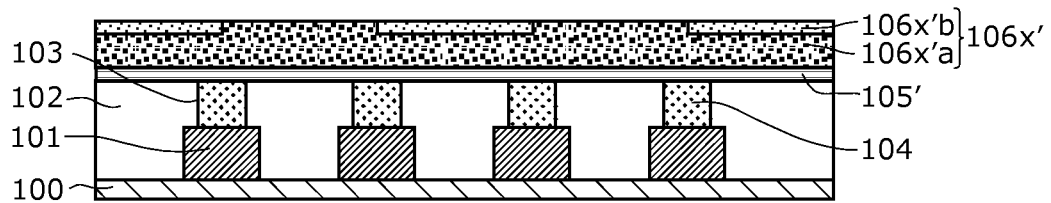
FIG. 12C is a cross sectional view illustrating a process in a first method of manufacturing the nonvolatile memory device according to Embodiment 3.

Next, as FIG. 12C and FIG. 13C show, the thinned resist mask 108 above the metal oxide material layer 106x'' is removed, and the first metal oxide region 106x'a is exposed to the surface. It should be noted that, similar to the first method of manufacturing according to Embodiment 1, it is preferable that the removal of the resist mask 108 is performed under the condition that the first metal oxide region 106x'a is difficult to be oxidized. Here, similar to Embodiment 1, the removal of the resist mask 108 is exemplified by wet etching using an ammonia hydrogen peroxide aqueous solution. It should be noted that when the resist mask 108 is removed by wet etching, an extremely thin natural oxide film is formed on the surface of the first metal oxide region 106x'a, but since the film thickness of this natural oxide film does not exceed the film thickness of the second variable resistance layer 106y, this does not effect the narrowing of the surface area of the region capable of being broken down.

As a result, a first variable resistance film 106x' including the second metal oxide region 106x'b and a first metal oxide region 106x'a, which is the region other than the second metal oxide region 106x'b, is formed. It should be noted that in the first method of manufacturing according to Embodiment 3, similar to the first method of manufacturing in Embodiment 1, since the processes of forming the second metal oxide region 106x'b does not include processing which changes the thickness of the film such as etching, the main surface of the first variable resistance film 106x' is flat.

Figure 12D:
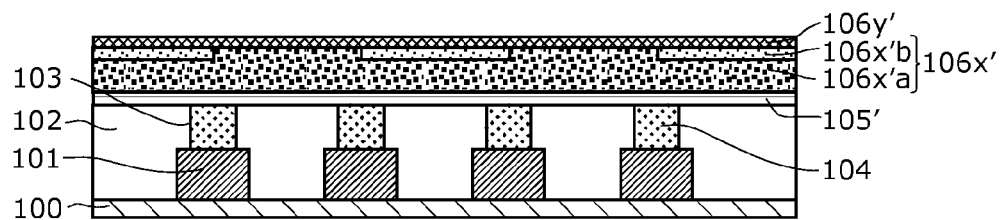
FIG. 12D is a cross sectional view illustrating a process in a first method of manufacturing the nonvolatile memory device according to Embodiment 3.

Next, as FIG. 12D shows, the second variable resistance film 106y' comprising the third metal oxide is formed (deposited) above the first variable resistance film 106x'. Here, similar to the first method of manufacturing according to Embodiment 1, the second variable resistance film 106y' is formed by the so-called reactive sputtering method of sputtering a tantalum target in a gas atmosphere of argon (Ar) and oxygen. Similar to the first method of manufacturing according to Embodiment 1, the second variable resistance film 106y' is formed to have an oxygen content atomic percentage of 65 to 75 atm %, a resistivity of $10^7$ Ω-cm or greater, and a film thickness of 3 to 10 nm. In other words, the second variable resistance film 106y' has a greater oxygen concentration and greater resistance value than the first metal oxide region 106x'a of the first variable resistance film 106x'.

Figure 12E:
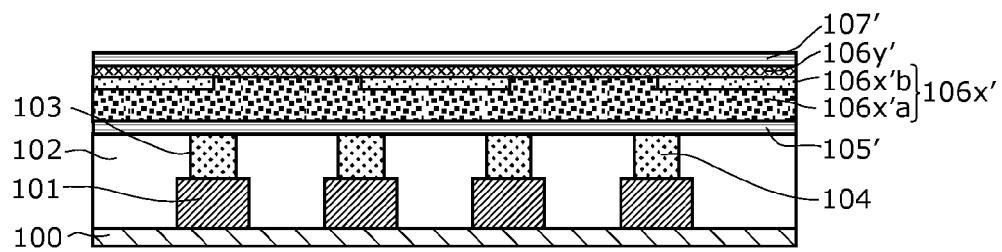
FIG. 12E is a cross sectional view illustrating a process in a first method of manufacturing the nonvolatile memory device according to Embodiment 3.

Next, as FIG. 12E shows, a second conductive film 107' comprising a noble metal (platinum (Pt), iridium (Ir), palladium (Pd), etc.), which is the second electrode material of the second electrode 107, is formed (deposited) above the second variable resistance film 106y'.

Figure 12F:
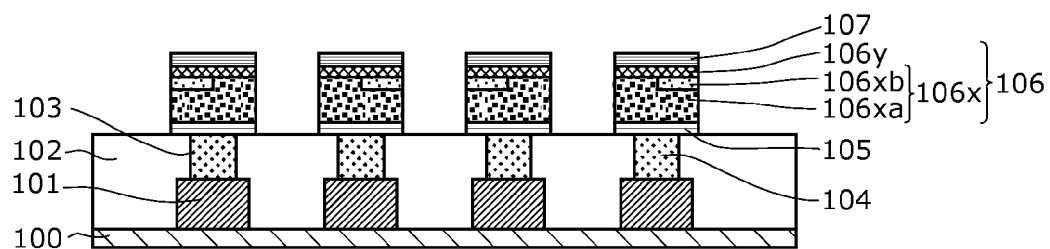
FIG. 12F is a cross sectional view illustrating a process in a first method of manufacturing the nonvolatile memory device according to Embodiment 3.

Next, as FIG. 12F shows, the first conductive film 105', the first variable resistance film 106x', the second variable resistance film 106y' and the second conductive film 107' shown in FIG. 12E are patterned using a desired mask. As a result, the variable resistance element 30 is formed in which the variable resistance layer 106 configured of the stacked first variable resistance layer 106x and second variable resistance layer 106y is formed between the first electrode 105 and the second electrode 107. It should be noted that similar to Embodiment 1, when a noble metal is used as the second electrode material in the second electrode 107, the variable resistance element 30 can be formed by making this into a hard mask. Moreover, similar to Embodiment 1, patterning is not required to be performed in one batch, but may be performed individually for each layer.

Similar to the first method of manufacturing according to Embodiment 1, by subsequently performing processes such as the process of covering the variable resistance element 30 with an interlayer insulating film, the process of forming a contact plug connected to the second electrode 107 of the variable resistance element 30, and the process of forming a top layer line connected to the contact plug (not shown in the Drawings), the nonvolatile memory device 1C including the variable resistance element 30 according to Embodiment 3 can be formed.

With the first method of manufacturing according to Embodiment 3, it is possible to use a rectangular resist mask 108 which is shared by four neighboring variable resistance elements 30 in the process of forming the resist mask 108, which is advantageous from a miniaturization standpoint. Furthermore, since a low cost mask can be used, it is possible to reduce manufacturing costs.

It should be noted that in Embodiment 3, since the surface area of the region capable of being broken down can be further narrowed, it is possible to further reduce irregularities in initial breakdown voltage.

[Second Method of Manufacturing]

An example of the second method of manufacturing the nonvolatile memory device 1C according to Embodiment 3 will be described with reference to FIG. 14A through FIG. 14C, as well as FIG. 13A and FIG. 13C. It should be noted that hereinafter, the nonvolatile memory device 1C will be described in the case that it is equipped with a plurality of the variable resistance elements 30 shown in FIG. 11.

Figure 14A:
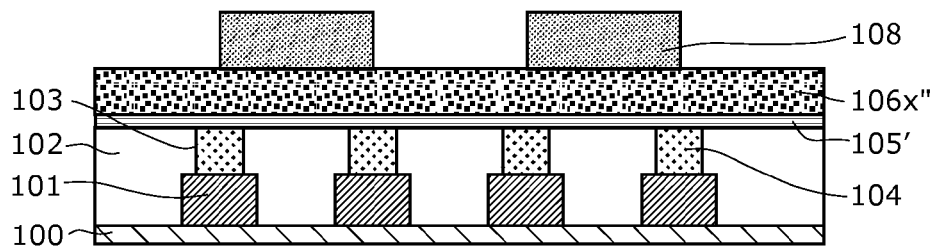
FIG. 14A is a cross sectional view illustrating a process in a second method of manufacturing the nonvolatile memory device according to Embodiment 3.
Figure 14B:
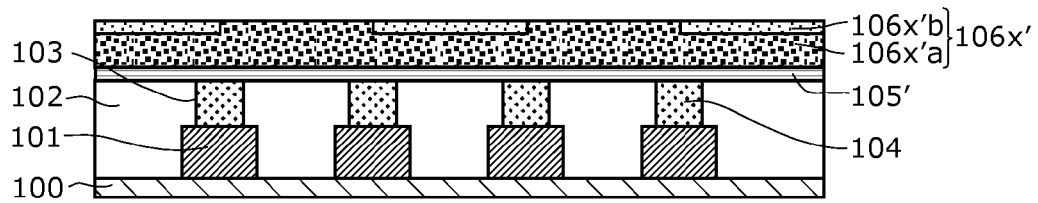
FIG. 14B is a cross sectional view illustrating a process in a second method of manufacturing the nonvolatile memory device according to Embodiment 3.
Figure 14C:
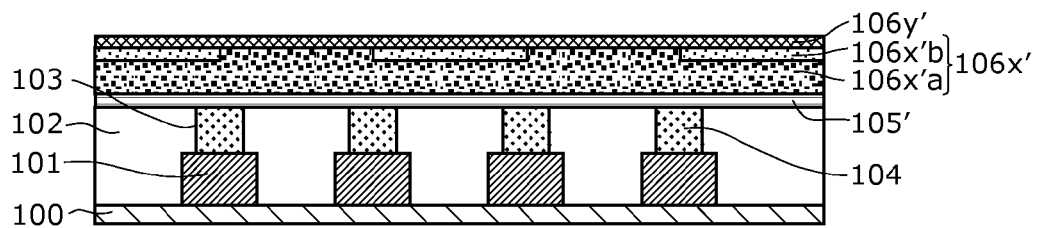
FIG. 14C is a cross sectional view illustrating a process in a second method of manufacturing the nonvolatile memory device according to Embodiment 3.

The second method of manufacturing according to Embodiment 3 is different from the first method of manufacturing according to Embodiment 3 in that the process of forming the second metal oxide region $106x'b$ shown in FIG. 14B and the process of removing the resist mask 108 shown in FIG. 14C are performed concurrently.

It should be noted that the second method of manufacturing according to Embodiment 3 corresponds with the second method of manufacturing according to Embodiment 1, but is different from the second method of manufacturing according to Embodiment 1 in that a common resist mask 108 is formed to be shared by four of the variable resistance elements 30 arranged in a two-by-two pattern when a memory cell array in which a plurality of the variable resistance elements 30 are arranged in an array in rows and columns is to be manufactured.

FIG. 14A through FIG. 14C are cross sectional views illustrating configurations of the main portion of the nonvolatile memory device 1C in each process in the second method of manufacturing according to Embodiment 3. It should be noted that the processes before the process of forming the resist mask 108 shown in FIG. 14A are the same as those shown in FIG. 2A through FIG. 2D, and as such, descriptions thereof are omitted. In FIG. 14A through FIG. 14C, the same reference numbers are used for the same structural elements as those in FIG. 2A through FIG. 2D, and as such, descriptions thereof are omitted.

In the second method of manufacturing according to Embodiment 3, firstly, the processes up through the forming of the metal oxide material layer $106x''$ shown in FIG. 2A through FIG. 2D are performed using the same methods as in the first method of manufacturing according to Embodiment 1.

Next, as FIG. 14A and FIG. 13A show, the resist mask 108 is formed above the metal oxide material layer $106x''$ using photolithography. Here, the shape, measurement, and positioning of the resist mask 108 is the same as that in first method of manufacturing according to Embodiment 3. More specifically, as FIG. 13A shows, the shape of the resist mask 108 having contact with the main surface is rectangular and is arranged to extend over regions in which four neighboring variable resistance elements 30 are formed in a two-by-two pattern and arranged so that each corner of the resist mask 108 is included in one of the formation regions of the four variable resistance elements 30. It should be noted that in Embodiment 3, the resist mask 108 is formed to extend over the regions in which four neighboring variable resistance elements 30 are formed, but the resist mask 108 may be formed to extend over two neighboring variable resistance elements 30.

Next, as FIG. 14B shows, using a dry etching device, by performing oxidation with plasma generated in gas containing oxygen, a second metal oxide region $106x'b$ is formed in the region of the metal oxide material layer $106x''$ not covered by the resist mask 108 at the same time as the resist mask 108 is removed whereby the first metal oxide region $106x'a$ is exposed to the surface. At this time, when the nonvolatile memory device 1C is viewed from above, the nonvolatile memory device 1C is as FIG. 13C shows. The second metal oxide region $106x'b$ is formed to have an oxygen content atomic percentage of 65 to 75 atm %, a resistivity of $10^7$ Ω-cm or greater, and a film thickness of 3 to 10 nm. In the second method of manufacturing according to Embodiment 3, a dry etching device is used to perform the formation of the second metal oxide region $106x'b$ and the removal of the resist mask 108 concurrently, but an ashing device or a plasma oxidation device may be used.

As a result, a first variable resistance film $106x'$ including the second metal oxide region $106x'b$ and a first metal oxide region $106x'a$, which is the region other than the second metal oxide region $106x'b$, is formed. It should be noted that in the second method of manufacturing according to Embodiment 3, similar to the second method of manufacturing in Embodiment 1, since the processes of forming the second metal oxide region $106x'b$ does not include processing which changes the thickness of the film such as etching, the main surface of the first variable resistance film $106x'$ is flat.

Next, as FIG. 14C shows, the second variable resistance film $106y'$ comprising the third metal oxide is formed (deposited) above the first variable resistance film $106x'$. More specifically, in the second method of manufacturing according to Embodiment 3, the second variable resistance film $106y'$ is formed by the so-called reactive sputtering method of sputtering a tantalum target in a gas atmosphere of argon (Ar) and oxygen. The second variable resistance film $106y'$ is formed to have an oxygen content atomic percentage of 65 to 75 atm %, a resistivity of $10^7$ Ω-cm or greater, and a film thickness of 3 to 10 nm. In other words, the second variable resistance film $106y'$ has a greater oxygen concentration and greater resistance value than the first metal oxide region $106x'a$ of the first variable resistance film $106x'$.

Next, similar to the first method of manufacturing according to Embodiment 1, the process of forming the second conductive film $107'$ shown in FIG. 2I and the process of patterning the first conductive film $105'$, the first variable resistance film $106x'$, the second variable resistance film $106y'$, and the second conductive film $107'$ shown in FIG. 2J are performed. This completes the nonvolatile memory device 1C.

Similar to the first method of manufacturing according to Embodiment 3, with the second method of manufacturing according to Embodiment 3, the resist mask 108 for forming the first metal oxide region $106x'a$ and the second metal oxide region $106x'b$ in the first variable resistance film $106x$ is formed extending over four neighboring variable resistance elements 30 arranged in a two-by-two pattern, which is advantageous from a miniaturization standpoint. Furthermore, since a low cost mask can be used, it is possible to reduce manufacturing costs.

Moreover, similar to the second method of manufacturing according to Embodiment 1, in the second method of manufacturing according to Embodiment 3, since the removal of the resist mask 108 and the formation of the second metal oxide region $106x'b$ are performed concurrently, there is no need to perform an independent processes solely for removing the resist mask 108. As such, the number manufacturing processes performed can be reduced, making it possible to reduce manufacturing costs.

[Third Method of Manufacturing]

An example of the third method of manufacturing the nonvolatile memory device 1C according to Embodiment 3 will be described with reference to FIG. 15A through FIG. 15C, as well as FIG. 8A and FIG. 8C. It should be noted that hereinafter, the nonvolatile memory device 1C will be described in the case that it is equipped with a plurality of the variable resistance elements 30 shown in FIG. 11.

The third method of manufacturing according to Embodiment 3 is different from the second method of manufacturing according to Embodiment 3 in that the formation of the second metal oxide region 106x'b, the removal of the resist mask 108, and the formation (depositing) of the second variable resistance film 106y' are performed consecutively within the same device.

It should be noted that the third method of manufacturing according to Embodiment 3 corresponds with the third method of manufacturing according to Embodiment 1, but is different from the third method of manufacturing according to Embodiment 1 in that a common resist mask 108 is formed to be shared by four of the variable resistance elements 30 arranged in a two-by-two pattern when a memory cell array in which a plurality of the variable resistance elements 30 are arranged in an array in rows and columns is to be manufactured.

Figure 15A:
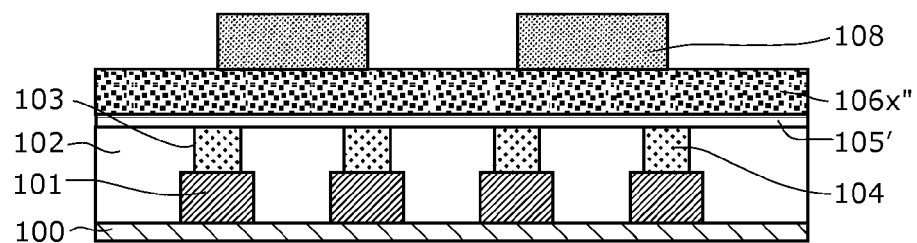
FIG. 15A is a cross sectional view illustrating a process in a third method of manufacturing the nonvolatile memory device according to Embodiment 3.
Figure 15B:
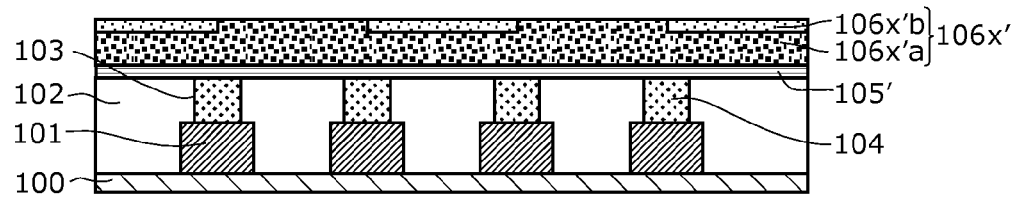
FIG. 15B is a cross sectional view illustrating a process in a third method of manufacturing the nonvolatile memory device according to Embodiment 3.
Figure 15C:
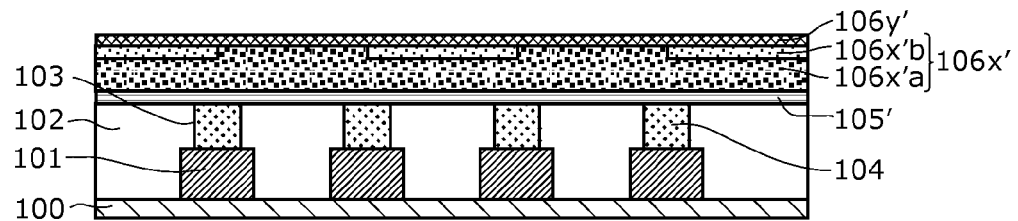
FIG. 15C is a cross sectional view illustrating a process in a third method of manufacturing the nonvolatile memory device according to Embodiment 3.

FIG. 15A through FIG. 15C are cross sectional views illustrating configurations of the main portion of the nonvolatile memory device 1C in each process in the third method of manufacturing according to Embodiment 3. It should be noted that the processes before the process of forming the resist mask 108 shown in FIG. 15A are the same as those shown in FIG. 2A through FIG. 2D, and as such, descriptions thereof are omitted. Moreover, in FIG. 15A through FIG. 15C, the same reference numbers are used for the same structural elements as those in FIG. 2A through FIG. 2J, and as such, descriptions thereof are omitted.

In the third method of manufacturing according to Embodiment 3, firstly, the processes up through the forming of the metal oxide material layer 106x''' shown in FIG. 2A through FIG. 2D are performed using the same methods as in the first method of manufacturing according to Embodiment 1.

Next, as FIG. 15A and FIG. 13A show, the resist mask 108 is formed above the metal oxide material layer 106x''' using photolithography. Here, the shape, measurement, and positioning of the resist mask 108 is the same as that in first method of manufacturing according to Embodiment 3. More specifically, as FIG. 13A shows, the shape of the resist mask 108 having contact with the main surface is rectangular and is arranged to extend over regions in which four neighboring variable resistance elements 30 are formed in a two-by-two pattern and arranged so that each corner of the resist mask 108 is included in one of the formation regions of the four variable resistance elements 30. It should be noted that in Embodiment 3, the resist mask 108 is formed to extend over the regions in which four neighboring variable resistance elements 30 are formed, but the resist mask 108 may be formed to extend over two neighboring variable resistance elements 30.

Next, as FIG. 15B shows, using a dry etching device, by performing oxidation with plasma generated in gas containing oxygen, a second metal oxide region 106x'b is formed in the region of the metal oxide material layer 106x''' not covered by the resist mask 108 at the same time as the resist mask 108 is removed whereby the first metal oxide region 106x'a is exposed to the surface. At this time, when the nonvolatile memory device 1C is viewed from above, the nonvolatile memory device 1C is as FIG. 13C shows. The second metal oxide region 106x'b is formed to have an oxygen content atomic percentage of 65 to 75 atm %, a resistivity of $10^7$ Ω-cm or greater, and a film thickness of 3 to 10 nm.

Next, as FIG. 15C shows, in the dry etching device used to perform the removal of the resist mask 108 and the formation of the second metal oxide region 106x'b concurrently, the second variable resistance film 106y' is formed above the first variable resistance film 106x' by performing an oxidation process immediately thereafter. More specifically, the second variable resistance film 106y' is formed by performing oxidation with plasma generated in gas containing oxygen in the dry etching device used to perform the process of removing of the resist mask 108 and forming the second metal oxide region 106x'b concurrently, immediately after the process of removing of the resist mask 108 and forming the second metal oxide region 106x'b. At this time, as FIG. 15B shows, the process of forming the second variable resistance film 106y' starts while the first metal oxide region 106x'a is exposed to the surface, and as such, the second variable resistance film 106y' is formed by oxidizing the surface layer portion of the first metal oxide region 106x'a.

It should be noted that since the second variable resistance film 106y' is formed by oxidizing the surface layer portion of the metal oxide material layer 106x''', the third metal of the third metal oxide (TaO$_z$) included in the second variable resistance film 106y' and the first metal of the first metal oxide (TaO$_x$) included in the metal oxide material layer 106x''' are the same. In Embodiment 3, similar to Embodiment 1, the first metal, the second metal, and the third metal are each tantalum (Ta). Moreover, in the third method of manufacturing according to Embodiment 3, the oxygen content atomic percentage of the second variable resistance film 106y' may be set to be the same as that of the second metal oxide (TaO$_y$). In other words, the second variable resistance film 106y' is formed to have an oxygen content atomic percentage of 65 to 75 atm %, a resistivity of $10^7$ Ω-cm or greater, and a film thickness of 3 to 10 nm. The second variable resistance film 106y' has a greater oxygen concentration and greater resistance value than the first metal oxide region 106x'a of the first variable resistance film 106x'.

It should be noted that in the third method of manufacturing according to Embodiment 3, the consecutively performed processes of forming the second metal oxide region 106x'b, removing the resist mask 108, and forming the second variable resistance film 106y' are performed using a dry etching device, but an ashing device may be used, or a plasma oxidation device may be used.

As a result, (i) the first variable resistance film 106x' including the second metal oxide region 106x'b and a first metal oxide region 106x'a, which is the region other than the second metal oxide region 106x'b, and (ii) the second variable resistance film 106y' are formed consecutively. It should be noted that since the consecutively performed processes of forming the second metal oxide region 106x'b, removing the resist mask 108, and forming the second variable resistance film 106y' do not include processing which changes the thickness of the film such as etching, the main surface of the first variable resistance film 106x' is flat.

Next, the process of forming the second conductive film 107' shown in FIG. 2I and the process of patterning the first conductive film 105', the first variable resistance film 106x', the second variable resistance film 106y', and the second conductive film 107' shown in FIG. 2J are performed. This completes the nonvolatile memory device 1C.

Similar to the first and second methods of manufacturing according to Embodiment 3, with the third method of manufacturing according to Embodiment 3, the resist mask 108 for forming the first metal oxide region 106x'a and the second metal oxide region 106x'b in the first variable resistance film 106x is formed extending over four neighboring variable resistance elements 30 arranged in a two-by-two pattern, which is advantageous from a miniaturization standpoint. Furthermore, since a low cost mask can be used, it is possible to reduce manufacturing costs.

Moreover, similar to the third method of manufacturing according to Embodiment 1, in the third method of manufacturing according to Embodiment 3, since the removal of the resist mask 108, for forming of the second metal oxide region 106x'b, and the forming of the second variable resistance film 106y' are consecutively performed in one device, there is no need for an independent process for forming the second variable resistance film 106y. This makes it possible to realize a reduction in manufacturing processes and reduce manufacturing time and cost.

With the first through third methods of manufacturing according to Embodiment 3, it is possible to form the nonvolatile memory device 1C in which the surface area of the region capable of being broken down in the variable resistance layer 106 can be reduced, with a method where film thickness can be favorably controlled since a process which changes the film thickness, such as etching, is not used. Moreover, with any of the first through third methods of manufacturing, the variable resistance element 30 is formed by patterning after formation of the second metal oxide region 106x'b. For this reason, compared to when the second metal oxide region 106x'b is formed after patterning is performed, it is possible to reduce the occurrence of dimensional irregularities between elements.

Fourth Embodiment

The nonvolatile memory device and method of manufacturing the same according to Embodiment 4 will be described with reference to FIG. 16.

The nonvolatile memory device 1D according to Embodiment 4 is different from the nonvolatile memory device 1A according to Embodiment 1 in presence of a diode element 50.

[Element Structure]

First, the structure of a nonvolatile memory device 1D according to Embodiment 4 including a variable resistance element 40 and the diode element 50 will be described with reference to FIG. 16. (a) in FIG. 16 shows a cross sectional view of an example of a configuration of the nonvolatile memory device 1D according to Embodiment 4 including the variable resistance element 40 and the diode element 50, and corresponds with the line A-A' in (b) in FIG. 16. (b) in FIG. 16 is a planar view when viewed from above the main surface of the first variable resistance layer 106x of the nonvolatile memory device 1D shown in (a) in FIG. 16.

Figure 16:
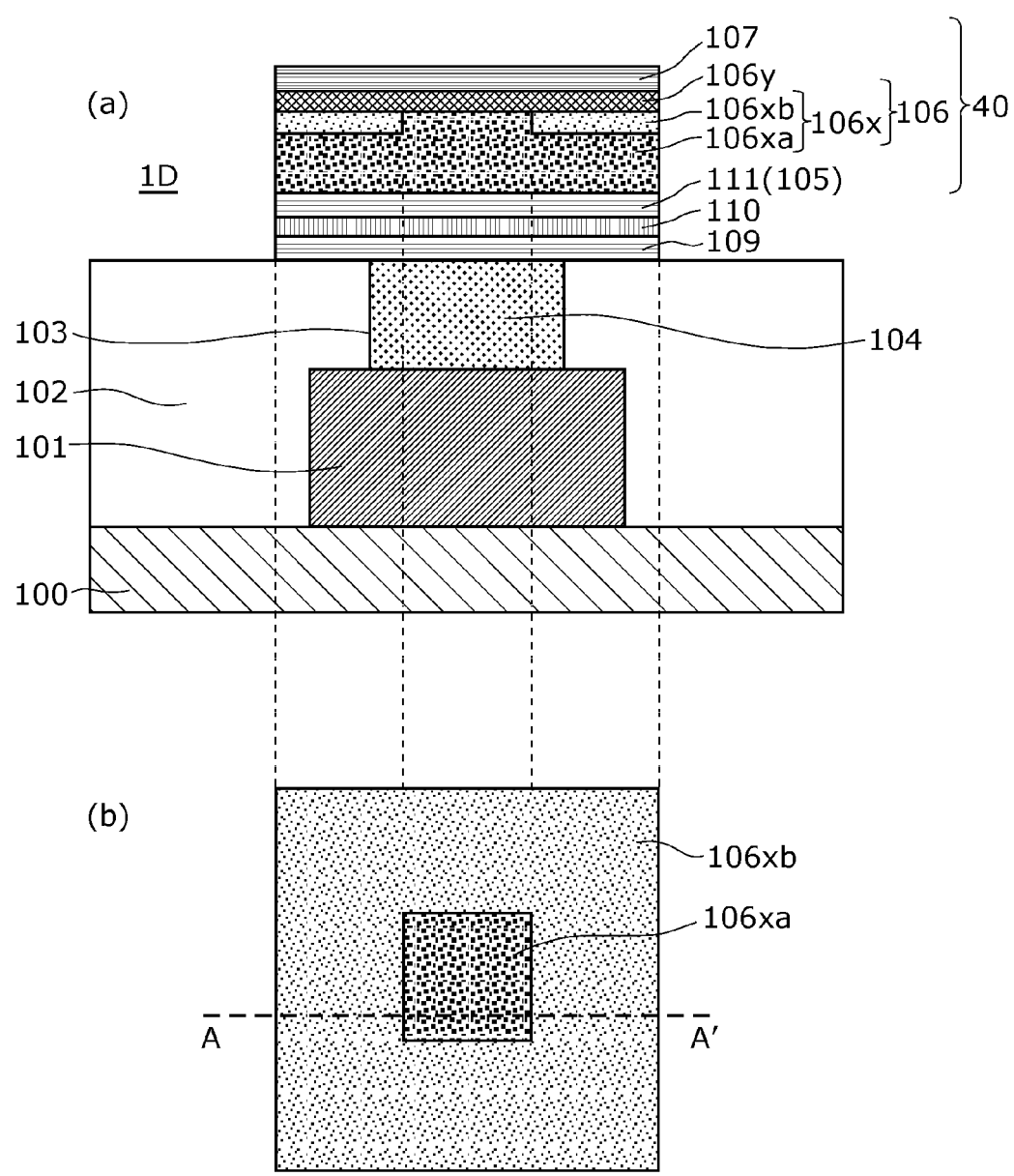
FIG. 16 shows cross sectional and planar views of an example of a configuration of the nonvolatile memory device according to Embodiment 4.

As (a) in FIG. 16 shows, the nonvolatile memory device 1D includes the substrate 100, the bottom layer line 101 formed above the substrate 100, the interlayer insulating layer 102 that covers the surface of the substrate 100 and the bottom layer line 101, the contact plug 104 formed to fill the contact hole 103 which goes through the interlayer insulating layer 102 and reaches the bottom layer line 101, and a memory cell in which the diode element 50 and the variable resistance element 40 are connected in series. It should be noted that the configurations (materials and shapes) of the substrate 100, the bottom layer line 101, the interlayer insulating layer 102, the contact hole 103, and the contact plug 104 are the same as those in the nonvolatile memory device 1A according to Embodiment 1.

The diode element 50 includes, a third electrode 109 formed above the interlayer insulating layer 102 to cover the contact plug 104, a semiconductor layer 110 formed above the third electrode 109, and a fourth electrode 111 formed above the semiconductor layer 110. In the diode element 50, the surface of third electrode 109 is planarized, and the surface of the semiconductor layer 110 formed thereabove is formed to be flat.

The variable resistance element 40 includes the first electrode 105, the variable resistance layer 106 formed above the first electrode 105, and the second electrode 107 formed above the variable resistance layer 106. Here, the first electrode 105, the configurations (materials and shapes) of the variable resistance layer 106, and the second electrode 107 in the variable resistance element 40 are the same as those in the variable resistance element 10 according to Embodiment 1. In other words, similar to the variable resistance element 10, in the main surface of the first variable resistance layer 106x, the low oxygen concentration region 106xa does not have a point of tangency with the outer perimeter of the variable resistance layer 106. It should be noted that the variable resistance element 40 may be formed to have the same configuration as the variable resistance element 20 according to Embodiment 2 or the variable resistance element 30 according to Embodiment 3.

Moreover, in Embodiment 4, the first electrode 105 in the variable resistance element 40 is exemplified as being formed as one with the fourth electrode 111 in the diode element 50. It should be noted that the first electrode 105 in the variable resistance element 40 may be formed independent and separate from the fourth electrode 111 in the diode element 50.

Similar to the variable resistance element 10 according to Embodiment 1, the variable resistance element 20 according to Embodiment 2, and the variable resistance element 30 according to Embodiment 3, the variable resistance element 40 according to Embodiment 4 has a configuration in which the region capable of being broken down in the second variable resistance layer 106y is narrowed due to the high oxygen concentration region 106xb, and as such, the current density flowing through the region capable of being broken down can be increased beyond that of conventional art. This makes it possible for a reduced initial breakdown voltage to be used, based on the narrowed region.

Furthermore, in Embodiment 4, the nonvolatile memory device 1D includes a memory cell in which the variable resistance element 40 and the diode element 50 are connected in series (in other words, a 1D1R memory cell), but typically with a 1D1R memory cell, voltage to be distributed to the diode element 50 must be added meaning the voltage applied to the cell must be increased, and as such, the demand for a reduced voltage is even higher. With Embodiment 4, as described above, it is possible to narrow the region capable of being broken down in the second variable resistance layer 106y since the variable resistance element 40 in the nonvolatile memory device 1D includes the high oxygen concentration region 106xb, and as such, is applicable to 1D1R memory cells which demand a further reduced initial breakdown voltage. Furthermore, since the amount of current flowing when the initial breakdown operation is performed can be reduced due to the reduction in initial breakdown voltage, it possible to sufficiently prevent the diode element 50 from breaking down.

It should be noted that in Embodiment 4, the diode element 50 is formed below the variable resistance element 40 to have contact with the first electrode 105 of the variable resistance element 40, but the diode element may be formed above the variable resistance element 40 to have contact with the second electrode 107 of the variable resistance element 40.

Variations of Embodiments 1 Through 4

Embodiments 1 through 4 exemplified a stacked structure in which, above the substrate 100, the first electrode 105, the first variable resistance layer 106x, the second variable resistance layer 106y, and the second electrode 107 are stacked in this order, but the reverse of this order is also acceptable. In other words, above the substrate 100, the second electrode 107, the second variable resistance layer 106y, the first variable resistance layer 106x, and the first electrode 105 may be stacked in this order. In this case as well, the high oxygen concentration region 106xb in the first variable resistance layer 106x is formed to have contact with the second variable resistance layer 106y and not have contact with the first electrode 105.

Moreover, in Embodiments 1 through 4, the first metal included in the first metal oxide, the second metal included in the second metal oxide, and the third metal included in the third metal oxide are all exemplified as being tantalum (Ta), but they are not limited to this example.

A metal other than tantalum may be used as the metal included in the variable resistance layer (the first metal, the second metal, and the third metal). It is possible to use a transition metal or aluminum (Al) as the metal included in the variable resistance layer. Tantalum (Ta), titanium (Ti), hafnium (Hf), zirconium (Zr), niobium (Nb), tungsten (W), Nickel (Ni) and such may be used as the transition metal. Since transition metals can assume many different oxidation states, it is possible to achieve different resistance states through oxidation-reduction reactions.

When hafnium oxide is used and the composition of the first metal oxide included in the low oxygen concentration region 106xa of the first variable resistance layer 106x is $HfO_x$ and the composition of the third metal oxide included in the second variable resistance layer 106y is $HfO_z$, it is preferable that $0.9 \leq x \leq 1.6$ and $1.8 < z < 2.0$.

In this case, the high oxygen deficiency layer (the first variable resistance layer 106x) comprising hafnium oxide can be formed with a reactive sputtering method of sputtering an Hf target in argon gas and oxygen gas, for example. The oxygen content atomic percentage of the high oxygen deficiency layer can be easily adjusted by changing the flow rate of oxygen gas to argon gas in the reactive sputtering, similar to the case with the tantalum oxide described above. It should be noted that a substrate does not especially need to be heated; room temperature is acceptable.

A low oxygen deficiency layer comprising hafnium oxide (the second variable resistance layer 106y) is formed by, for example, exposing the surface of the high oxygen deficiency layer to a plasma of argon gas and oxygen gas. The film thickness of the low oxygen deficiency layer can be easily adjusted by changing the exposure time to the plasma of the argon gas and oxygen gas. The film thickness of the second variable resistance layer 106y is preferably 3 to 4 nm.

When zirconium oxide is used and the composition of the first metal oxide included in the low oxygen concentration region 106xa of the first variable resistance layer 106x is $ZrO_x$ and the composition of the third metal oxide included in the second variable resistance layer 106y is $ZrO_z$, it is preferable that $0.9 \leq x \leq 1.4$ and $1.9 < z < 2.0$.

In this case, the high oxygen deficiency layer (the first variable resistance layer 106x) comprising zirconium oxide can be formed with a reactive sputtering method of sputtering a Zr target in argon gas and oxygen gas, for example. The oxygen content atomic percentage of the high oxygen deficiency layer can be easily adjusted by changing the flow rate of oxygen gas to argon gas in the reactive sputtering, similar to the case with the tantalum oxide described above. It should be noted that a substrate does not especially need to be heated; room temperature is acceptable.

A low oxygen deficiency layer comprising zirconium oxide (the second variable resistance layer 106y) is formed by, for example, exposing the surface layer portion of the high oxygen deficiency layer to a plasma of argon gas and oxygen gas. The thickness of the low oxygen deficiency layer can be easily adjusted by changing the exposure time to the plasma of the argon gas and oxygen gas. The film thickness of the second variable resistance layer 106y is preferably 1 to 5 nm.

It should be noted that the above-described hafnium oxide layer and zirconium oxide layer can be formed by CVD or atomic layer deposition (ALD) instead.

It should be noted that in Embodiments 1 through 4, except for in the third method of manufacturing, a different metal may be used for the first metal included in the first metal oxide and the third metal included in the third metal oxide.

In this case, the third metal oxide may have a lower degree of oxygen deficiency—that is to say, a greater resistance—than the first metal oxide. With such a configuration, the voltage applied between the first electrode and the second electrode during a resistance change is distributed to the third metal oxide in majority, thereby allowing oxidation-reduction reactions to occur more easily in the third metal oxide.

Moreover, when the first metal included in the first metal oxide to become the first variable resistance layer and the third metal included in the third metal oxide to become the third variable resistance layer are different materials, the standard electrode potential of the third metal may be lower than the standard electrode potential of the first metal. The higher the standard electrode potential, the less a metal tends to oxidize. With this, oxidation-reduction reactions occur easily in the third metal oxide having a relatively low standard electrode potential. It should be noted that this is because it is conceivable that the resistance changing phenomenon occurs as the resistance value (degree of oxygen deficiency) changes due to the filament (conductive path) changing as oxidation-reduction reactions occur in the fine localized region formed inside the high-resistance third metal oxide.

For example, by using oxygen-deficient tantalum oxide ($TaO_x$) for the first metal oxide and titanium oxide ($TiO_2$) for the third metal oxide, a stable resistance changing operation can be achieved. Titanium (standard electrode potential=−1.63 eV) has a lower standard electrode potential than tantalum (standard electrode potential=−0.6 eV). Oxidation-reduction reactions can be made to occur more easily in the third metal oxide by using, for the third metal oxide, a metal oxide having a lower standard electrode potential than that of first metal oxide. As an example of other possible combinations, aluminum oxide ($Al_2O_3$) may be used as the third metal oxide to become the high resistance layer. For example, oxygen-deficient tantalum oxide ($TaO_x$) may for the first metal oxide and aluminum oxide ($Al_2O_3$) may be used for the third metal oxide.

With such as structure, when voltage is applied to the variable resistance element 10, 20, 30, or 40, majority of the voltage is applied to the second variable resistance layer 106y having a low degree of oxygen deficiency, which indicates a higher resistance value. Moreover, an abundance of oxygen capable of contributing to the reaction is present in the vicinity of the boundary between the second electrode 107 and the second variable resistance layer 106y. As such, oxidation and reduction reactions selectively occur at this interface between the second electrode 107 and the second variable resistance layer 106y, resulting in stabilized changes in resistance.

Furthermore, as a primary variable resistance layer performing a change in resistance, the high and low oxygen deficiency layers may include an oxide layer comprising tantalum, hafnium, or zirconium, for example, and may also comprise a trace amount of another chemical element. Intentionally including another chemical element in order to finely adjust the resistance value is also possible and doing so is also intended to be included within the scope of the present invention. For example, when nitrogen is added to the variable resistance layer, the resistance value of the variable resistance layer increases, and the responsiveness to a change in resistance can be improved.

Moreover, when forming a resistive film by sputtering, it goes without saying that an unintended trace amount of an element being mixed into the resistive film as a result of residual gas or gas emission from the walls of the vacuum chamber also falls within scope of the present invention.

In the above Embodiments, the process of forming the high oxygen concentration region 106xb is described as using plasma oxidation, but the high oxygen concentration region 106xb can be formed by oxygen ion injection. When, in particular, an ion beam is radiated perpendicular to the main surface of the metal oxide material layer 106x", since a high oxygen concentration region 106xb is formed in which only the dimensional irregularities of the resist mask 108 are transferred, it is possible to reduce irregularities caused by other processes.

In the above embodiments, in the process for forming the high oxygen concentration region 106xb, it is described that the high oxygen concentration region 106xb is formed to not have contact with the first electrode 105, but the method of manufacturing can be applied to a structure in which the high oxygen concentration region 106xb has contact with the first electrode 105.

Though the nonvolatile memory device and method of manufacturing the same according to the present invention have been described by way of the embodiments, the present invention is not limited to these embodiments. The present invention also includes variations of the embodiment conceived by those skilled in the art unless they depart from the spirit and scope of the present invention. Moreover, embodiments resulting from arbitrary combinations of constituent elements of different exemplary embodiments are intended to be included within the scope of the present invention as long as these do not depart from the essence of the present invention.

INDUSTRIAL APPLICABILITY

The present invention provides a variable resistance nonvolatile memory device and a method of manufacturing a nonvolatile memory device, and since a reliable nonvolatile memory which operates stably can be achieved, can be applied to a variety of electronics fields which use nonvolatile memory using a variable resistance nonvolatile memory device.

REFERENCE SIGNS LIST 1A, 1B, 1C, 1D nonvolatile memory device
10, 20, 30, 40 variable resistance element
50 diode element
100 substrate
101 bottom layer line
102 interlayer insulating layer
103 contact hole
104 contact plug
105 first electrode
105' first conductive film
106 variable resistance layer
106x" metal oxide material layer
106x' first variable resistance film
106x first variable resistance layer
106x'a first metal oxide region
106xa low oxygen concentration region
106x'b second metal oxide region
106xb high oxygen concentration region
106y' second variable resistance film
106y second variable resistance layer
107 second electrode
107' second conductive film
108 resist mask
109 third electrode
110 semiconductor layer
111 fourth electrode

The invention claimed is:

1. A method of manufacturing a nonvolatile memory device, the method comprising:
   forming a first electrode;
   forming, above the first electrode, a metal oxide material layer comprising a first metal oxide;
   forming a mask above a portion of a main surface of the metal oxide material layer;
   forming, in a region of the metal oxide material layer not covered by the mask, a high oxygen concentration region comprising a second metal oxide having a degree of oxygen deficiency lower than a degree of oxygen deficiency of the first metal oxide, to form a first variable resistance layer including the metal oxide material layer in which the high oxygen concentration region is formed;
   removing the mask;
   forming, above the first variable resistance layer, a second variable resistance layer comprising a third metal oxide having a degree of oxygen deficiency lower than the degree of oxygen deficiency of the first metal oxide; and
   forming a second electrode above the second variable resistance layer.

2. The method according to claim 1,
   wherein in the forming of a high oxygen concentration region, the region of the metal oxide material layer not covered by the mask is oxidized.

3. The method according to claim 1,
   wherein the forming of a high oxygen concentration region and the removing of the mask are performed concurrently.

4. The method according to claim 1,
   wherein the forming of a second variable resistance layer is performed by a reactive sputtering method in an oxygen atmosphere.

5. The method according to claim 3,
   wherein the forming of a second variable resistance layer is performed immediately following the forming of a high oxygen concentration region and the removing of the mask, using a device that concurrently performs the forming of a high oxygen concentration region and the removing of the mask.

6. The method according to claim 1,
   wherein when a plurality of variable resistance elements each including the first electrode, the first variable resistance layer, the second variable resistance layer, and the second electrode are to be formed, in the forming of a mask, the mask is formed to be shared by a plurality of neighboring ones of the variable resistance elements.

7. The method according to claim 1,
wherein in the forming of a high oxygen concentration region, the high oxygen concentration region is formed to have a film thickness smaller than a film thickness of the metal oxide material layer.

\* \* \* \* \*